United States Patent
Seo et al.

(10) Patent No.: US 10,453,801 B2
(45) Date of Patent: Oct. 22, 2019

(54) SEMICONDUCTOR DEVICES AND SEMICONDUCTOR PACKAGES INCLUDING MAGNETIC SHIELDING LAYERS AND METHODS OF MANUFACTURING SEMICONDUCTOR DEVICES AND SEMICONDUCTOR PACKAGES

(71) Applicants: Bo-young Seo, Suwon-si (KR); Yong-kyu Lee, Gwacheon-si (KR)

(72) Inventors: Bo-young Seo, Suwon-si (KR); Yong-kyu Lee, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/093,006

(22) Filed: Apr. 7, 2016

(65) Prior Publication Data

US 2017/0047507 A1 Feb. 16, 2017

(30) Foreign Application Priority Data

Aug. 13, 2015 (KR) .................. 10-2015-0114546

(51) Int. Cl.
*H01L 43/08* (2006.01)
*H01L 23/552* (2006.01)
(Continued)

(52) U.S. Cl.
CPC .......... *H01L 23/552* (2013.01); *G11C 11/161* (2013.01); *G11C 11/1695* (2013.01); *H01L 24/73* (2013.01); *H01L 25/0657* (2013.01); *H01L 43/08* (2013.01); *G11C 2211/5615* (2013.01); *H01L 27/228* (2013.01); *H01L 2224/16225* (2013.01);
(Continued)

(58) Field of Classification Search
CPC ... H01L 23/552; H01L 27/228; H01L 23/768; H01L 23/28; H01L 43/02; H01L 43/12; H01L 21/336; H01L 43/08; H01L 24/73; H01L 2224/73265; G11C 11/161; G11C 2211/5615
See application file for complete search history.

(56) References Cited

U.S. PATENT DOCUMENTS 6,888,184 B1 5/2005 Shi et al.
7,815,820 B2 10/2010 Tan et al.
(Continued)

OTHER PUBLICATIONS

Watanabe, et al., "A Novel U-shaped Magnetic Shield for Perpendicular MRAM", Packaging & Test Technology Division, Renesas Electronics Corporation. (2012) pp. 920-925.

*Primary Examiner* — Charles D Garber
*Assistant Examiner* — S M Sohel Imtiaz
(74) *Attorney, Agent, or Firm* — Harness, Dickey & Pierce, P.L.C.

(57) ABSTRACT

A magnetic random-access memory (MRAM) device and a semiconductor package include a magnetic shielding layer that may suppress at least one of magnetic orientation errors and deterioration of magnetic tunnel junction (MTJ) structures due to external magnetic fields. A semiconductor device includes: a MRAM chip including a MRAM; and a magnetic shielding layer including an upper shielding layer and a via shielding layer. The upper shielding layer is on a top surface of the MRAM chip, and the via shielding layer extends from the upper shielding layer and passes through the MRAM chip.

17 Claims, 58 Drawing Sheets

(51) Int. Cl.
  *G11C 11/16*   (2006.01)
  *H01L 23/00*   (2006.01)
  *H01L 25/065*  (2006.01)
  *H01L 27/22*   (2006.01)

(52) U.S. Cl.
  CPC ........... *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/92247* (2013.01); *H01L 2225/0651* (2013.01); *H01L 2225/06537* (2013.01); *H01L 2225/06562* (2013.01); *H01L 2924/15311* (2013.01); *H01L 2924/181* (2013.01)

(56) References Cited

U.S. PATENT DOCUMENTS

| | | | |
|---|---|---|---|
| 8,269,319 B2 | 9/2012 | Honer et al. | |
| 8,415,775 B2 | 4/2013 | Katti | |
| 8,963,336 B2 | 2/2015 | Jung et al. | |
| 2005/0116255 A1* | 6/2005 | Kato | B82Y 10/00 257/200 |
| 2005/0226030 A1 | 10/2005 | Kato et al. | |
| 2006/0163700 A1* | 7/2006 | Bae | H01L 22/34 257/620 |
| 2010/0164077 A1* | 7/2010 | Bando | H01L 23/49503 257/659 |
| 2011/0095435 A1* | 4/2011 | Volant | H01L 21/76898 257/774 |
| 2012/0205764 A1* | 8/2012 | Chen | G11C 11/16 257/422 |
| 2012/0211846 A1 | 8/2012 | Li et al. | |
| 2012/0267780 A1* | 10/2012 | Chen | H01L 21/78 257/737 |
| 2013/0264720 A1* | 10/2013 | Chun | H01L 23/481 257/774 |
| 2014/0042571 A1* | 2/2014 | Gan | H01L 43/02 257/421 |
| 2014/0070426 A1 | 3/2014 | Park et al. | |
| 2014/0197505 A1 | 7/2014 | Zhou et al. | |
| 2014/0225208 A1* | 8/2014 | Gu | H01L 43/02 257/422 |
| 2014/0252642 A1* | 9/2014 | Lou | H01L 21/78 257/773 |
| 2015/0084141 A1* | 3/2015 | Fujimori | H01L 23/552 257/421 |
| 2015/0091109 A1 | 4/2015 | Allinger et al. | |
| 2015/0221598 A1* | 8/2015 | Lee | H01L 27/228 257/295 |
| 2015/0228590 A1* | 8/2015 | Oh | H01L 21/561 257/659 |
| 2015/0333018 A1* | 11/2015 | Kim | H01L 43/02 257/422 |
| 2016/0276393 A1* | 9/2016 | Huang | H01L 27/14618 |
| 2016/0284981 A1* | 9/2016 | Bhushan | H01L 23/552 |
| 2017/0025471 A1* | 1/2017 | Bhushan | H01L 43/12 |

* cited by examiner

| STRUCTURE | SIMULATED $H_{in}$ AT COMPARISON POINT [Oe] | STRUCTURE IMAGE |
|---|---|---|
| U-SHAPED | 28 |  |
| PLATE-SHAPED | 50 |  |
| CYLINDER-SHAPED | 27 |  |
| COVER-SHAPED | 47 |  |

SEMICONDUCTOR DEVICES AND SEMICONDUCTOR PACKAGES INCLUDING MAGNETIC SHIELDING LAYERS AND METHODS OF MANUFACTURING SEMICONDUCTOR DEVICES AND SEMICONDUCTOR PACKAGES

CROSS-REFERENCE TO RELATED APPLICATION

This application claims priority under 35 U.S.C. § 119 to Korean Patent Application No. 10-2015-0114546, filed on Aug. 13, 2015, in the Korean Intellectual Property Office, the disclosure of which is incorporated herein in its entirety by reference.

BACKGROUND

Field

Example embodiments relate to semiconductor memory apparatuses, for example, semiconductor devices including nonvolatile magnetic layers, and methods of manufacturing semiconductor devices.

Description of Related Art

Demands for semiconductor products include smaller volumes and higher data processing rates. To this end, increases in operating speed and degree of integration of memory devices used in semiconductor products may be required. In order to meet these demands, a resistive memory such as a MRAM that performs memory functions using changes in resistance due to changes in polarity of a magnetic material has been suggested. Recently, methods of manufacturing semiconductor memory devices including MRAMs have been researched, and may be applied to mobile devices that require relatively high processing speeds, relatively low power consumption, and relatively high reliability.

SUMMARY

One or more example embodiments of inventive concepts provide semiconductor devices and/or semiconductor packages including magnetic shielding layers that may suppress and/or prevent magnetic orientation errors and/or deterioration of magnetic tunnel junction (MTJ) structures due to external magnetic fields. One or more example embodiments also provide methods of manufacturing semiconductor devices and/or semiconductor packages.

According to at least one example embodiment of inventive concepts, a semiconductor device comprises: a magnetic random access memory (MRAM) chip including a MRAM; and a magnetic shielding layer including an upper shielding layer and a via shielding layer. The upper shielding layer is on a top surface of the MRAM chip. The via shielding layer extends from the upper shielding layer and passes through the MRAM chip.

According to at least one other example embodiment of inventive concepts, a semiconductor device including: a magnetic random access memory (MRAM) MRAM chip including a MRAM having a perpendicular magnetic tunnel junction (pMTJ) structure; and a via shielding layer passing through the MRAM chip. The via shielding layer has a top surface exposed through a top surface of the MRAM chip, and a bottom surface exposed through a bottom surface of the MRAM chip. The via shielding layer includes a ferromagnetic material.

According to at least one example embodiment of inventive concepts, a magnetic random-access memory (MRAM) package including: a package substrate; a MRAM chip stacked on the package substrate and including a MRAM; a magnetic shielding layer including an upper shielding layer and a via shielding layer; and a sealing material formed to seal the MRAM chip and the magnetic shielding layer. The upper shielding layer is on a top surface of the MRAM chip, and the via shielding layer extends from the upper shielding layer and passes through the MRAM chip.

According to at least one other example embodiment of inventive concepts provides a method of manufacturing a semiconductor device, the method including: forming a plurality of magnetic random access memory (MRAM) chips on a wafer, each of the plurality of MRAM chips including a MRAM having a perpendicular magnetic tunnel junction (pMTJ) structure; forming at least one hole in each of the plurality of MRAM chips; depositing a ferromagnetic material on a top surface of the wafer to form a via shielding layer and an upper shielding layer connected to the via shielding layer, the via shielding layer filling the at least one hole formed in each of the plurality of MRAM chips, and the upper shielding layer covering a top surface of each of the plurality of MRAM chips; patterning the upper shielding layer to expose a portion of each of the plurality of MRAM chips including pads; and sawing the wafer to singulate each of the plurality of MRAM chips.

According to one other example embodiment of inventive concepts, there is provided a method of manufacturing a magnetic random-access memory (MRAM) package, the method including: preparing a semiconductor device including: a MRAM chip including a MRAM having a perpendicular magnetic tunnel junction (pMTJ) structure; and a magnetic shielding layer including an upper shielding layer and a via shielding layer, the upper shielding layer formed on a top surface of the MRAM chip, and the via shielding layer extending from the upper shielding layer and passing through the MRAM chip; depositing a ferromagnetic material on a package substrate to form a substrate shielding layer; stacking the semiconductor device on the package substrate to connect the via shielding layer to the substrate shielding layer; and forming a sealing material to seal the semiconductor device.

According to at least some example embodiments, the MRAM may further include a perpendicular magnetic tunnel junction (pMTJ) structure; a portion of the top surface of the MRAM chip may be exposed through an open area in the upper shielding layer; and pads may be on the portion of the top surface of the MRAM chip.

An outer portion of the MRAM chip corresponding to a scribe lane may be exposed through the open area.

The magnetic shielding layer may include a ferromagnetic material.

The via shielding layer may include at least one of (i) at least one pillar structure and (ii) a barrier structure along a side surface of the MRAM chip.

The via shielding layer may be on a portion of the MRAM chip outside a portion of the MRAM chip including pads.

The magnetic shielding layer may further include a lower shielding layer on a bottom surface of the MRAM chip. The lower shielding layer may cover an entire bottom surface of the MRAM chip. The lower shielding layer may be connected to the upper shielding layer by the via shielding layer.

The via shielding layer may be formed in a security area that is protected from a magnetic field effect.

The MRAM may include a perpendicular magnetic tunnel junction (pMTJ) structure, and the magnetic shielding layer may include a ferromagnetic material.

The MRAM chip may be electrically connected to the package substrate by wire bonding, and pads of the MRAM chip may be exposed through the upper shielding layer.

The magnetic shielding layer may further include a substrate shielding layer on a top surface of the package substrate, and the upper shielding layer and the substrate shielding layer may be connected to each other by the via shielding layer.

The MRAM package may further include substrate pads exposed through the substrate shielding layer; wherein the substrate pads are electrically connected to the MRAM chip, and the substrate shielding layer has an area greater than or equal to an area of the MRAM chip.

The magnetic shielding layer may further include a lower shielding layer on a bottom surface of the MRAM chip. The upper shielding layer and the lower shielding layer may be connected to each other by the via shielding layer.

Before forming at least one hole, an insulating film may be removed from top surfaces of the pads.

Before sawing the wafer, an insulating film may be removed from top surfaces of the pads.

The patterning the upper shielding layer may include exposing a scribe lane portion of the wafer.

Before sawing the wafer, a ferromagnetic material may be deposited on a bottom surface of the wafer to form a lower shielding layer connected to the via shielding layer.

The preparing of the semiconductor device may include: forming a plurality of MRAM chips on a wafer, each of the plurality of MRAM chips including a MRAM having a pMTJ structure; forming at least one hole through each of the plurality of MRAM chips; depositing a ferromagnetic material on the wafer to form a via shielding layer and an upper shielding layer, the via shielding layer filling the at least one hole formed through each of the plurality of MRAM chips, and the upper shielding layer covering a top surface of each of the plurality of MRAM chips, the upper shielding layer connected to the via shielding layer; patterning the upper shielding layer to remove a portion of the upper shielding layer at a portion of each of the MRAM chips, the portion of each of the MRAM chips including pads of a corresponding MRAM chip among the plurality of MRAM chips; and sawing the wafer to singulate each of the plurality of MRAM chips.

Before one of the forming at least one hole and the patterning the upper shielding layer, an insulating film may be removed from top surfaces of the pads to expose the top surfaces of the pads.

The substrate shielding layer may be patterned to expose substrate pads electrically connected to the MRAM chip.

The substrate shielding layer may be removed from an outer portion of the package substrate so that an area of the substrate shielding layer is equal or substantially equal to an area of the MRAM chip.

At least one other example embodiment provides a method of manufacturing a semiconductor device, the method including: forming at least one first through-hole through a semiconductor wafer; forming a ferromagnetic layer on the semiconductor wafer, the ferromagnetic layer filling the at least one first through-hole; patterning the ferromagnetic layer to expose at least a first pad area portion on an upper surface of the semiconductor wafer and to form a magnetic shielding layer, the magnetic shielding layer including at least a via shielding layer filling the at least one first through-hole; and cutting the semiconductor wafer to form the semiconductor device.

The at least one first through-hole may have an elongated edge that is parallel to an edge of the semiconductor device.

The method may further include: forming at least one second through-hole through the semiconductor wafer, the at least one first through-hole and the at least one second through-hole spaced apart from one another in a plane of the upper surface of the semiconductor wafer; and wherein the patterning may include removing at least a first portion of the ferromagnetic layer to expose the first pad area portion and a scribe lane on the upper surface of the semiconductor wafer, and to form an upper shielding layer on the upper surface of the semiconductor wafer, wherein the via shielding layer fills the at least one first through-hole and the at least one second through-hole.

The cutting the semiconductor wafer may include cutting the semiconductor wafer along the scribe lane to form the semiconductor device.

A bottom surface of the via shielding layer may be planar with a bottom surface of the semiconductor wafer.

A bottom surface of the via shielding layer may protrude from a bottom surface of the semiconductor wafer.

The first pad area portion may be between the at least one first through-hole and the at least one second through-hole.

The patterning may include removing at least a second portion of the ferromagnetic layer to expose a second pad area portion on the upper surface of the semiconductor wafer; wherein the first pad area portion is at a first side of the upper surface of the semiconductor wafer, the second pad area portion is at a second side of the upper surface of the semiconductor wafer, and the first and second sides are opposite one another.

The first pad area portion may be at a first side of the upper surface of the semiconductor wafer, the first through-hole and the second through-hole may be at a second side of the semiconductor wafer, and the first side may be opposite to the second side.

The forming at least one first through-hole may include forming a pair of first through-holes along opposite edges of the semiconductor wafer. The forming at least one second through-hole may include forming a pair of second through-holes along opposite edges of the semiconductor wafer. The first pad area portion may be between the pair of first through-holes and the pair of second through-holes, and the via shielding layer may fill the pair of first through-holes and the pair of second through-holes.

The first pad area portion may be exposed through a central portion of the ferromagnetic layer.

The forming at least one first through-hole may include forming a plurality of first through-holes along a first edge of the semiconductor wafer. The forming at least one second through-hole may include forming a plurality of second through-holes along a second edge of the semiconductor wafer, the second edge being opposite to the first edge. The via shielding layer may fill the plurality of first through-holes and the plurality of second through-holes.

The method may further include forming a lower shielding layer on a bottom surface of the semiconductor wafer.

The cutting may be performed without a scribe lane for the semiconductor device.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1A:
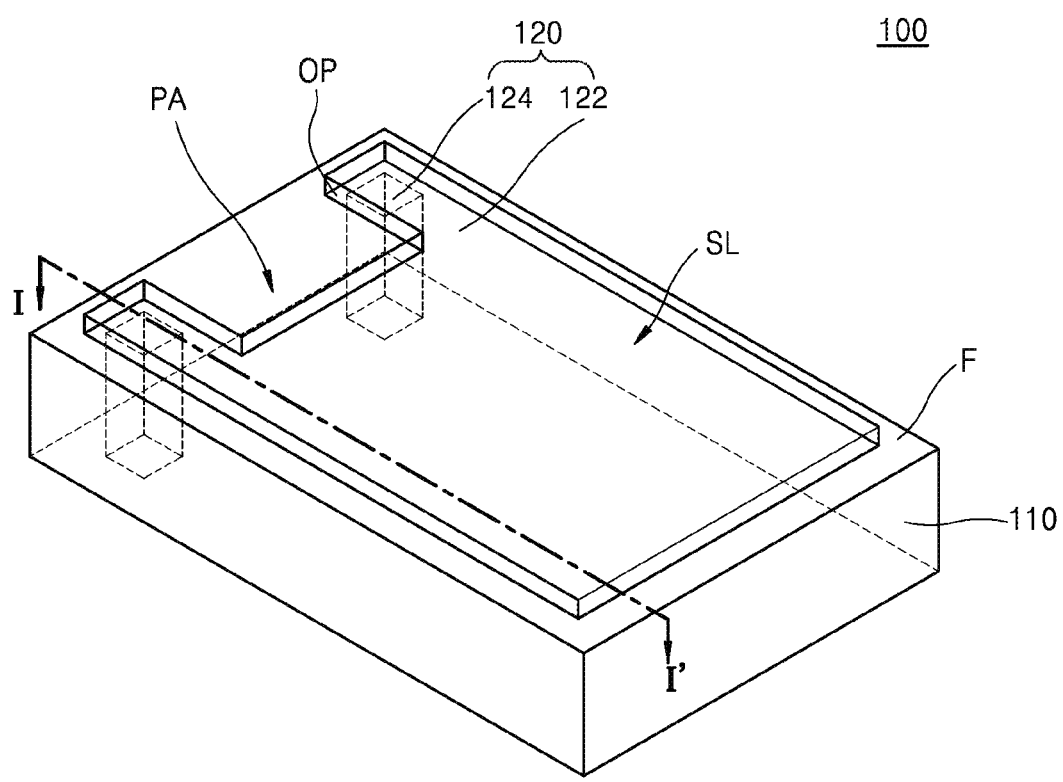
FIG. 1A is a perspective view of a semiconductor device according to an example embodiment.

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
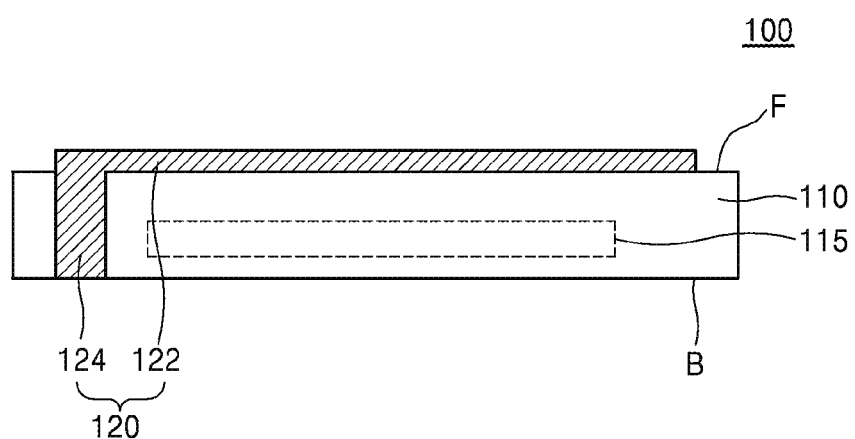
FIG. 1B is a cross-sectional view taken along line I-I' in FIG. 1A.

FIG. 1A is a perspective view of a semiconductor device 100 according to an example embodiment. FIG. 1B is a cross-sectional view taken along line I-I' in FIG. 1A.

Referring to FIGS. 1A and 1B, the semiconductor device 100 according to at least this example embodiment may include a MRAM chip 110 and a magnetic shielding layer 120.

The MRAM chip 110 may include a MRAM cell array 115 formed on a substrate. The MRAM cell array 115 may include a plurality of MRAM cells. The MRAM cell array 115 and the MRAM cells will be explained below in more detail below with reference to FIGS. 3A and 3B.

Figure 3A:
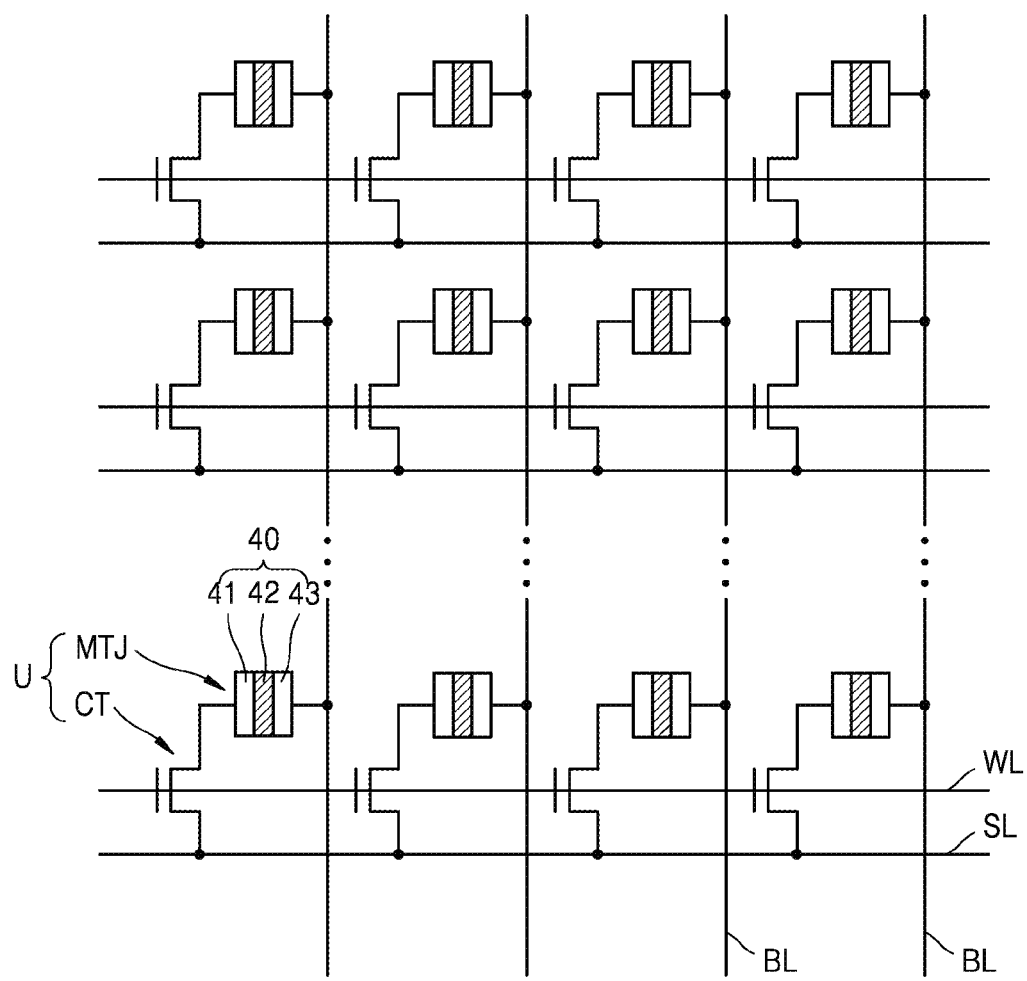
FIGS. 3A and 3B are circuit diagrams of example embodiments of MRAM cell arrays included in the semiconductor device of FIG. 1A.
Figure 3B:
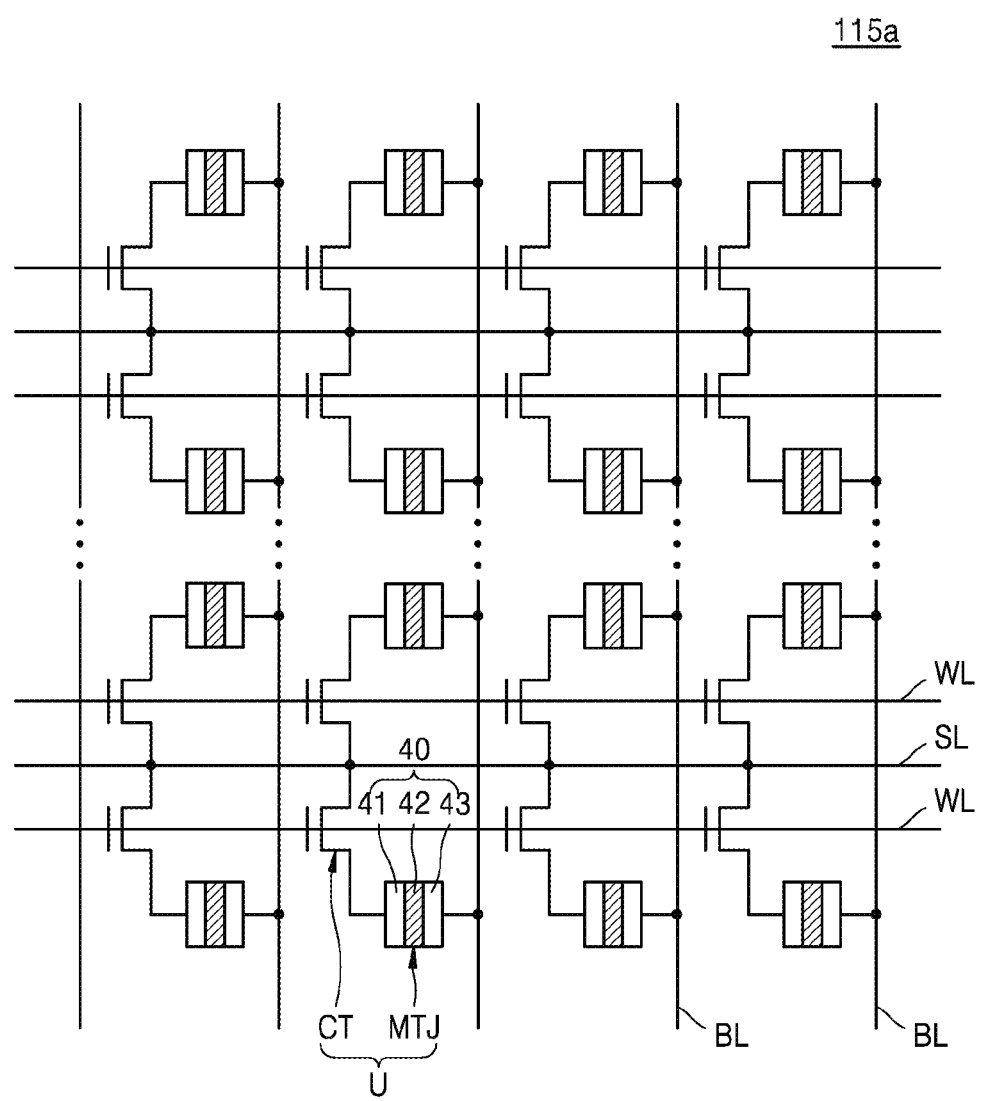

Each of the MRAM cells may include a magnetic tunnel junction (MTJ) structure (e.g., 40 in FIG. 3A or 3B). The MTJ structure may be a planar MTJ structure or a perpendicular MTJ structure. In the semiconductor device 100 according to at least this example embodiment, the MRAM cell may have a perpendicular MTJ structure. Alternatively, the MRAM cell in the semiconductor device 100 may have a planar MTJ structure. The MTJ structure or a principle of the MTJ structure will be explained below in more detail below with reference to FIGS. 4A through 5B.

The magnetic shielding layer 120 may include an upper shielding layer 122 and a via shielding layer 124. The upper shielding layer 122 may cover a top surface F (also referred to as an upper surface or front surface) of the MRAM chip 110. A portion of the top surface of the MRAM chip 110 on which a pad is disposed (referred to herein as a pad area PA) may be exposed through the upper shielding layer 122. In at least one example, the upper shielding layer 122 may include an open area OP that exposes the pad area PA. The top surface F of the MRAM chip 110 may be an active surface, whereas a bottom surface B of the MRAM chip 110, which is opposite to the top surface F, may be an inactive surface.

As shown in FIG. 1A, an outer portion of the top surface of the MRAM chip 110 may be exposed. The outer portion may correspond to a scribe lane along which a sawing process may be performed to singulate the semiconductor device 100 from a wafer or an area including the scribe lane. As such, since the upper shielding layer 122 does not exist on the outer portion of the top surface of the MRAM chip 110, the semiconductor device 100 may be more easily singulated during the sawing process.

The via shielding layer 124 may extend from the upper shielding layer 122 and may pass through the MRAM chip 110. In the semiconductor device 100 according to at least this example embodiment, the via shielding layer 124 may have a quadrangular pillar shape that passes through the MRAM chip 110. However, the via shielding layer 124 is not limited thereto, and may have any of various other pillar shapes such as a circular cylindrical shape, a polyprism shape, etc. A bottom surface of the via shielding layer 124 may be exposed through the bottom surface B of the MRAM chip 110. Also, the bottom surface of the via shielding layer 124 may be on the same or substantially the same plane as the bottom surface B of the MRAM chip 110. That is, for example, the bottom surface of the via shielding layer 124 may be planar or substantially planar with the bottom surface B of the MRAM chip 110.

The magnetic shielding layer 120 (including the upper shielding layer 122 and the via shielding layer 124) may be formed of a ferromagnetic material. For example, the upper shielding layer 122 and the via shielding layer 124 may include a ferromagnetic material including at least one of cobalt (Co), iron (Fe), nickel (Ni), alloys thereof, and the like. In more detail, for example, the upper shielding layer 122 and the via shielding layer 124 may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In the semiconductor device 100 according to at least this example embodiment, the upper shielding layer 122 and the via shielding layer 124 may be formed of, for example, permalloy that is an alloy of Ni and Fe. However, in the semiconductor device 100 according to at least this example embodiment, materials of the upper shielding layer 122 and the via shielding layer 124 are not limited to the example materials discussed above.

The upper shielding layer 122 and the via shielding layer 124 may be formed in a hole and on the top surface F of the MRAM chip 110 by using, for example, physical vapor deposition (PVD) such as sputtering, spin coating, plating, etc. However, methods of forming the upper shielding layer 122 and the via shielding layer 124 are not limited to the example methods discussed above.

A thickness of the upper shielding layer 122 may be tens of μm, and an area of the upper shielding layer 122 may be obtained by subtracting the pad area PA and an area corresponding to the scribe lane from an area of the MRAM chip 110. Also, a width and a length of the via shielding layer 124 may be tens to hundreds of μm, and a height of the via shielding layer 124 may be equal to or slightly greater than a thickness of the MRAM chip 110. However, sizes of the upper shielding layer 122 and the via shielding layer 124 are not limited to the above-discussed values. For example, the upper shielding layer 122 and the via shielding layer 124 may be formed to have any of various sizes according to a size of the MRAM chip 110, a position of the pad area PA, and/or an arrangement of the MRAM cells therein.

In the semiconductor device 100 according to at least this example embodiment, since the magnetic shielding layer 120 is formed on the top surface F of the MRAM chip 110 and in the hole, when the semiconductor device 100 is stacked on a package substrate including a substrate shielding layer to form a semiconductor package, a U-shaped or ⊏ ˅ -shaped ferromagnetic shielding structure may be formed, thereby enabling formation of a more reliable memory device having relatively high resistance to an external magnetic field. An external magnetic field shielding function of the U-shaped or ⊏ ˅ -shaped ferromagnetic shielding structure will be explained in more detail below with reference to FIGS. 14A through 17.

Also, in the semiconductor device 100 according to at least this example embodiment, since the magnetic shielding layer 120 is formed at a wafer level and singulation is performed by using sawing, the semiconductor device 100 has relatively little effect on a subsequent package process. Accordingly, problems such as an increased process difficulty, increased time and/or costs, which may be caused by an additional shielding layer in the package process, may be reduced.

Figure 2:
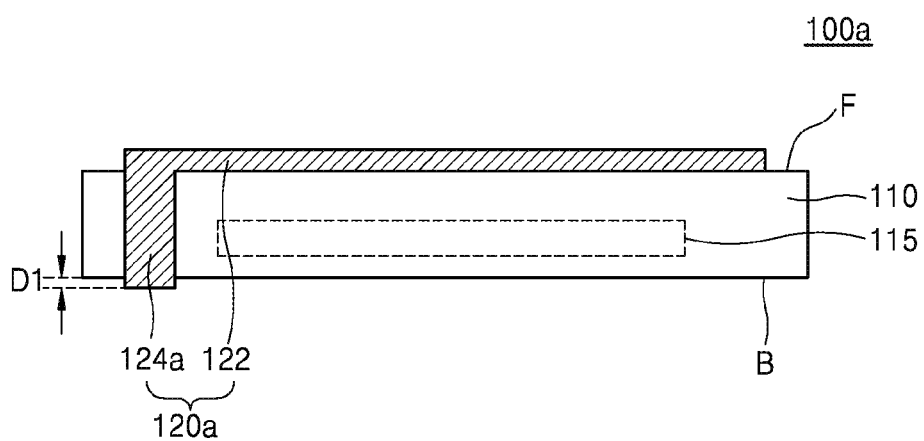
FIG. 2 is a cross-sectional view of another example embodiment of a semiconductor device.

FIG. 2 is a cross-sectional view of a semiconductor device 100a according to another example embodiment. The semiconductor device 100a is a modification of the semiconductor device 100 of FIG. 1B. For convenience of explanation, the description already made with reference to FIGS. 1A and 1B will be briefly given or omitted.

Referring to FIG. 2, the semiconductor device 100a is similar to the semiconductor device 100 of FIG. 1A except in a structure of a via shielding layer 124a. For example, in the semiconductor device 100a, a bottom surface of the via shielding layer 124a may protrude from the bottom surface B of the MRAM chip 110. A first thickness D1 of a protrusion of the via shielding layer 124a may be appropriately adjusted in consideration of a thickness of an adhesive layer 330 (see FIG. 19) when the semiconductor device 100a is stacked on a package substrate 200 (see FIG. 19). A structure of the magnetic shielding layer 120a, a material of the magnetic shielding layer 120a and/or a method of forming the magnetic shielding layer 120a are the same or substantially the same as those described above with regard to the magnetic shielding layer 120 in the semiconductor device 100 of FIG. 1A.

FIGS. 3A and 3B are circuit diagrams of the MRAM cell array 115 included in the semiconductor device 100 shown in FIG. 1A.

Referring to FIG. 3A, in the semiconductor device 100, the MRAM cell array 115 may include a plurality of word lines WL, a plurality of bit lines BL, a plurality of source lines SL, and a plurality of memory cells U at intersections between the word lines WL and the bit lines BL. One unit memory cell U may include an MTJ structure 40 and a cell transistor CT, and may be selected by selecting one bit line BL and one source line SL. Accordingly, the MRAM cell array 115 may have a 1MTJ-1TR structure. The MTJ structure 40 may generally include a pinned layer 41, a tunnel layer (or a barrier layer) 42, and a free layer 43.

An example connection structure of the unit memory cell U will now be explained. The pinned layer 41 of the MTJ structure 40 may be connected to a drain of the cell transistor CT and the free layer 43 of the MTJ structure 40 may be connected to the bit line BL. Also, a source of the cell transistor CT may be connected to the source line SL and a gate of the cell transistor CT may be connected to the word line WL.

For reference, general characteristics of a MRAM will now be briefly explained. The MRAM is a nonvolatile memory device based on magnetoresistance. For example, since the MRAM is nonvolatile, the MRAM may retain memory content even when power is shut off. Although a nonvolatile RAM is said to be slower than a volatile RAM, the MRAM may have a read/write response time that is as fast or substantially as fast as that of a volatile RAM. For example, the MRAM is an all-purpose memory device that may compete with a dynamic random-access memory (DRAM) in terms of relatively low costs and/or relatively high capacity, may compete with a static random-access memory (SRAM) in terms of relatively high speed operation, and may compete with a flash memory in terms of nonvolatile storage.

The MRAM may store data by using magnetoresistive elements. In more detail, for example, the magnetoresistive elements of the MRAM may include two magnetic layers and each of the two magnetic layers may be magnetized in one of two directions. A resistance value of an MTJ structure may vary according to a magnetization direction of a magnetic layer, and data may be programmed (stored) or removed (erased) using the variation of the resistance value. For example, the MRAM may read and write data by using the MTJ structure including two magnetic layers and an insulating film between the two magnetic layers.

The MRAM may change a magnetization direction of a magnetic layer using spin-transfer torque (STT). STT refers to a phenomenon in which a magnetization direction of a magnetic layer is changed when a spin-polarized current flows in one direction, and thus, spin of electrons is transferred. Accordingly, the MRAM using the STT is referred to as an STT-RAM or an STT-MRAM. The STT-MRAM may generally include the MTJ structure 40. The MTJ structure 40 may include the pinned layer 41, the free layer 43, and the tunnel layer 42 between the pinned layer 41 and the free layer 43 as described above.

In the MTJ structure 40 of the STT-MRAM, a magnetization direction of the pinned layer 41 may be fixed and a magnetization direction of the free layer 43 may be changed due to a program current applied to the free layer 43. The program current may change the magnetization direction of the free layer 43 so that the magnetization directions of the pinned layer 41 and the free layer 43 are parallel or anti-parallel to each other. Magnetization directions that are parallel to each other may indicate a low resistance state (referred to as a "0" state) between the pinned layer 41 and the free layer 43. Magnetization directions that are anti-parallel to each other may indicate a high resistance state (referred to as a "1" state) between the pinned layer 41 and the free layer 43. A write/read operation of the MRAM may be provided according to switching of the magnetization direction of the free layer 43 and a high or low resistance state between the pinned layer 41 and the free layer 43.

In more detail, for example, once a program current flows to the MTJ structure 40 in the STT-MRAM, the pinned layer 41 polarizes spin of electrons of the program current and the spin-polarized current interacts with the free layer 43 while applying a torque to the free layer 43. When the torque of the spin-polarized current that passes through the MTJ structure 40 is greater than a critical switching current density, the torque applied by the spin-polarized current may be great enough to switch the magnetization direction of the free layer 43. Accordingly, the magnetization direction of the free layer 43 may be aligned to be parallel or anti-parallel to the magnetization direction of the pinned layer 41, and a resistance state of the MTJ structure 40 is changed.

As such, in the STT-MRAM, since a magnetization direction of the free layer 43 is switched due to a spin-polarized electron current, a magnetic field which is formed by applying a relatively large amount of current in order to switch the magnetization direction of the free layer 43 is not necessary. Accordingly, the STT-MRAM may reduce a cell size, a program current and/or may suppress write failure problems. In addition, since the STT-MRAM has a relatively high tunnel magnetoresistance ratio and a relatively high ratio between high and low resistance states, a read operation in a magnetic domain may be improved.

The word line WL may be enabled by a row decoder, and may be connected to a word line driver that drives a word line selection voltage. The word line selection voltage activates the word line WL in order to perform a read or write operation in a logic state of the MTJ structure 40.

The source line SL is connected to a source line circuit. The source line circuit receives an address signal and a read/write signal, decodes the address signal and the read/write signal, and applies a source line selection signal to the selected source line SL. The source line SL applies a ground reference voltage to non-selected source lines SL.

The bit line BL is connected to a column selection circuit that is driven by a column selection signal. The column selection signal is selected by a column decoder. For example, the selected column selection signal turns on a column selection transistor in the column selection circuit and selects the bit line BL. A logic state of the MTJ structure 40 is output through a sense amplifier to the selected bit line BL during a read operation. Also, a write current is transmitted to the selected bit line BL during a write operation and the logic state is stored in the MTJ structure 40.

Referring to FIG. 3B, in the semiconductor device 100 according to at least this example embodiment, a MRAM cell array 115a may be similar to the MRAM cell array 115 of FIG. 3A, except in a connection structure of the source line SL. For example, the MRAM cell array 115 of FIG. 3A has a 1MTJ-1TR structure in which one cell transistor CT and one MTJ structure 40 are selected by selecting one bit line BL and one source line SL, whereas the MRAM cell array 115a may have a 2MTJ-2TR structure in which two cell transistors CT and two MTJ structures 40 are selected by selecting one bit line BL and one source line SL. Accordingly, in the MRAM cell array 115a, the source line SL may be commonly connected to sources of two cell transistors CT.

In general, the MRAM cell array 115 of FIG. 3A is referred to as having a separate source line structure, and the MRAM cell array 115a of FIG. 3B is referred to as having a common source line structure.

In the MRAM, a current flowing in the MTJ structure 40 has to be bidirectional in order to store logic "0" and "1" states in the MTJ structure 40. That is, for example, a direction in which a current flows in the MTJ structure 40 when data "0" is written has to be opposite to a direction in which a current flows in the MTJ structure 40 when data "1" is written. To this end, the MRAM may include the source line SL in addition to the bit line and may switch a potential difference between the MTJ structure 40 and the cell transistor CT to select a direction in which a current flows in the MTJ structure 40.

According to an example embodiment of a method of connecting the source line SL and operating the source line SL, the MRAM may be classified as one of the separate source line structure and the common source line structure. In the common source line structure, since both cell transistors share the source line SL, an area may be reduced. However, since a reference voltage is applied to the source line SL, an operating voltage may be increased. In contrast, in the separate source line structure, since voltages of the bit line BL and the source line SL are used by being exchanged with each other, an operating voltage may be reduced. However, since all source lines SL corresponding to the bit lines BL have to be arranged, an area may be increased and density may be reduced.

Figure 4A:
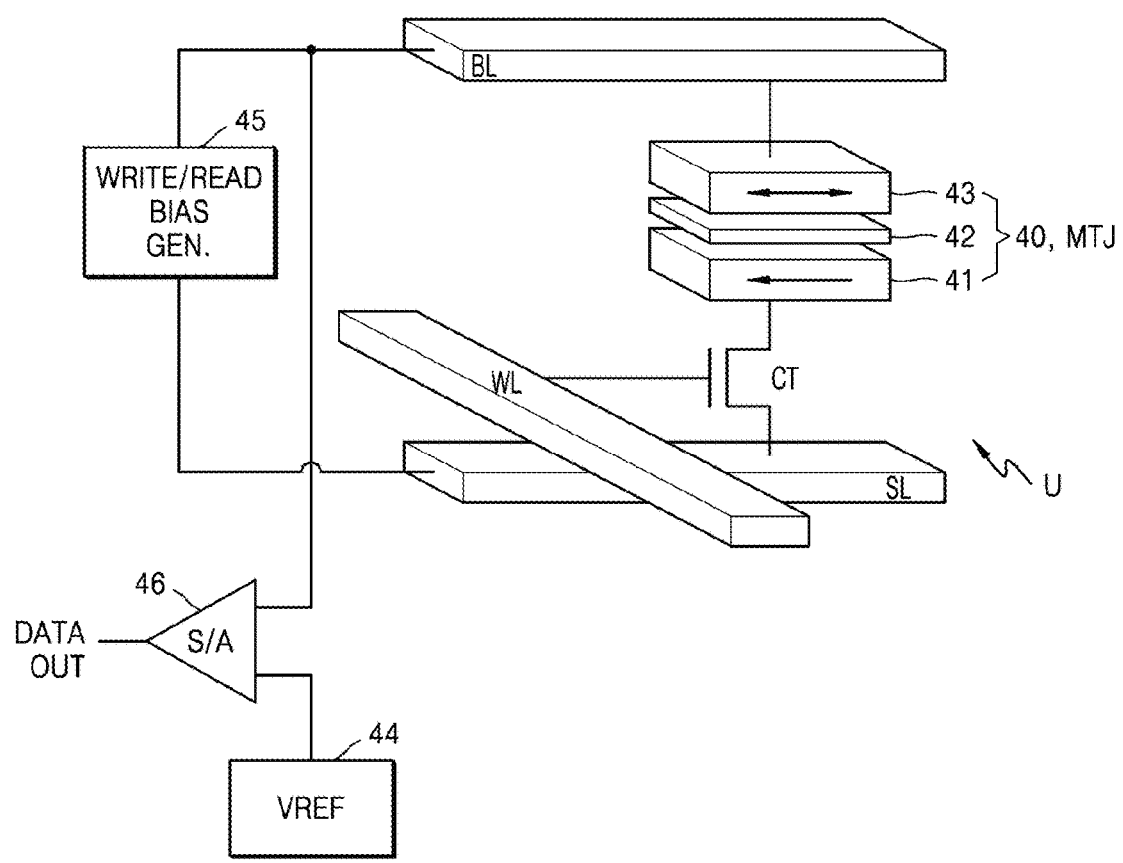
FIG. 4A is a perspective view of an example embodiment a unit memory cell in the MRAM cell array of FIG. 3A.
Figure 4B:
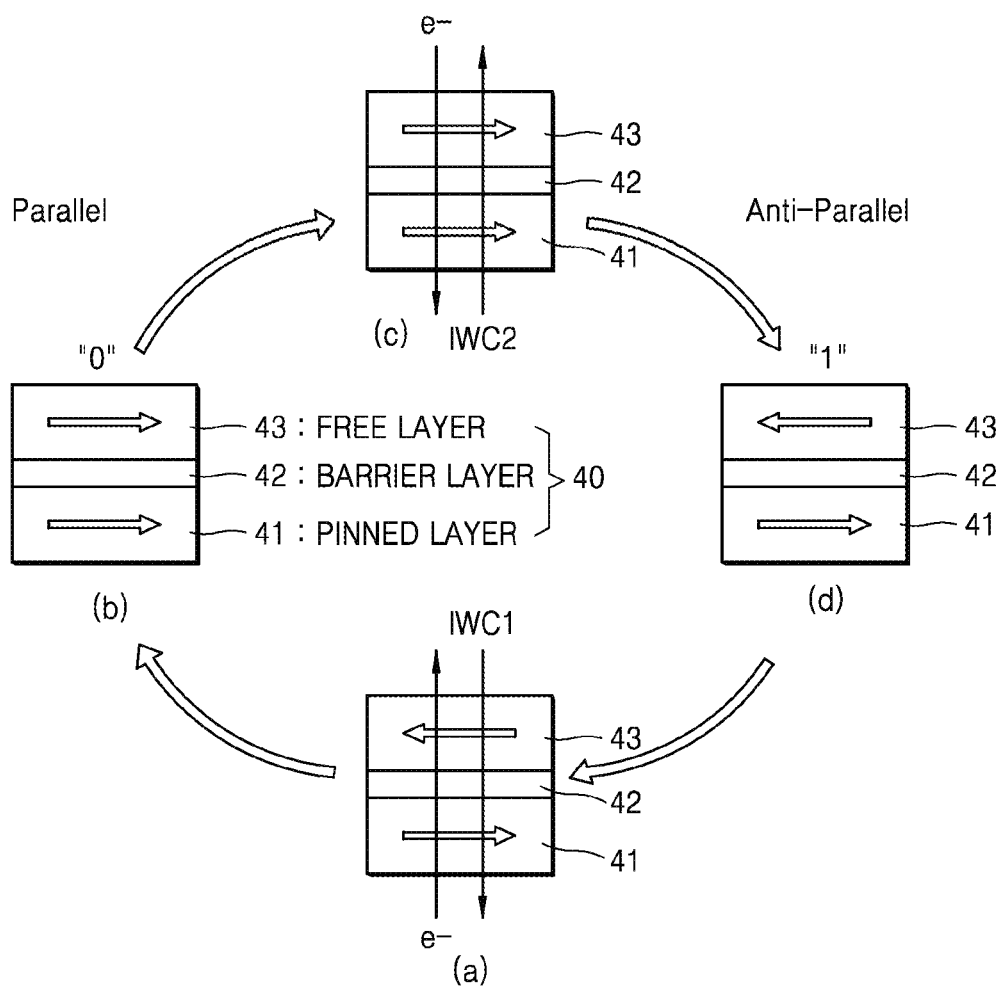
FIG. 4B is a conceptual view for explaining an example write operation in a magnetic-tunnel junction (MTJ) structure of FIG. 4A.

FIG. 4A is a perspective view of the unit memory cell U in the MRAM cell array 115 of FIG. 3A. FIG. 4B is a conceptual view for explaining an example write operation in the MTJ structure 40 of FIG. 4A.

Referring to FIG. 4A, the unit memory cell U of the MRAM cell array 115 (see FIG. 3A) may include the MTJ structure 40 and the cell transistor CT. A gate of the cell transistor CT may be connected to the word line WL and an electrode (e.g., a drain electrode) of the cell transistor CT may be connected to the bit line BL through the MTJ structure 40. Also, another electrode (e.g., a source electrode) of the cell transistor CT may be connected to the source line SL.

The MTJ structure 40 may include the pinned layer 41, the free layer 43, and the tunnel layer 42 between the pinned layer 41 and the free layer 43. A magnetization direction of the pinned layer 41 may be fixed, and a magnetization direction of the free layer 43 may be parallel or anti-parallel to the magnetization direction of the pinned layer 41 according to data stored by a write operation. In order to fix the magnetization direction of the pinned layer 41, for example, an anti-ferromagnetic layer may be further provided. A structure in which a magnetization direction is parallel to the tunnel layer 42, such as the MTJ structure 40, is referred to as a planar MTJ structure.

For a write operation of the MRAM cell, a logic-high voltage may be applied to the selected word line WL and the cell transistor CT may be turned on. A program current (e.g., a write current) supplied by a write/read bias generator circuit or circuitry (also referred to herein as a write/read bias generator) 45 may be applied to the selected bit line BL and the selected source line SL. A direction of the write current may be determined by a logic state to be stored in the MTJ structure 40.

For a read operation of the MRAM cell, a logic-high voltage may be applied to the selected word line WL and the cell transistor CT may be turned on and a read current may be applied to the selected bit line BL and the selected source line SL. Accordingly, a voltage may be developed at both ends of the MTJ structure 40, may be sensed by a sense amplifier 46, and may be compared with a voltage of a reference voltage generator circuit or circuitry (also referred to as a reference voltage generator) 44 in order to determine the logic state stored in the MTJ structure 40. According to a result of the comparison, the data stored in the MTJ structure 40 may be identified.

Referring to FIG. 4B, a magnetization direction of the free layer 43 may be determined according to a direction of a write current flowing in the MTJ structure 40. For example, as shown in (a), when a first write current IWC1 is applied from the free layer 43 to the pinned layer 41, free electrons having the same spin orientation as that of the pinned layer 41 apply a torque to the free layer 43. Accordingly, the free layer 43 may be magnetized to be parallel to the pinned layer 41, and data "0" having a low resistance value may be stored in the MTJ structure 40 as shown in (b).

In the MTJ structure 40 having a data "0" state, when a second write current IWC2 is applied from the pinned layer 41 to the free layer 43 as shown in (c), electrons having spin orientation that is opposite to that of the pinned layer 41 return to apply a torque to the free layer 43. Accordingly, the free layer 43 may be magnetized to be anti-parallel to the pinned layer 41, and data "1" having a high resistance value may be stored in the MTJ structure 40 as shown in (d).

As a result, a magnetization direction of the free layer 43 in the MTJ structure 40 may be changed to be parallel or anti-parallel to that of the pinned layer 41 due to STT, and thus data "0" or data "1" may be stored.

Figure 5A:
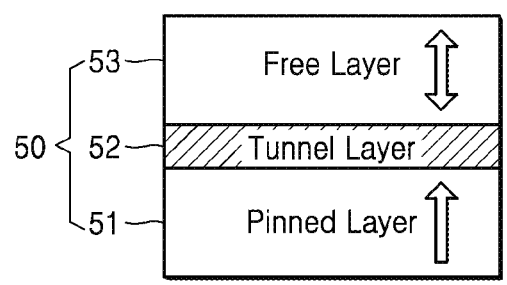
FIGS. 5A and 5B are conceptual views illustrating example modifications of the MTJ structure of FIG. 4A.
Figure 5B:
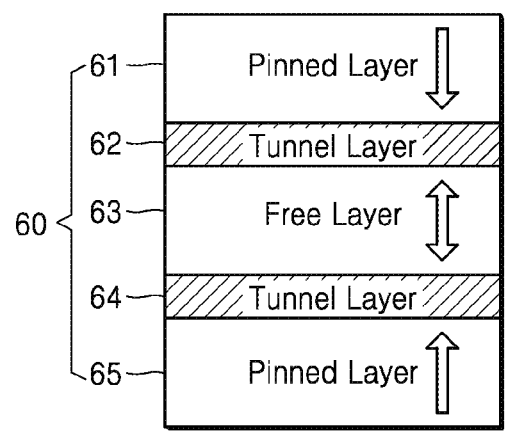

FIGS. 5A and 5B are conceptual views illustrating example modifications of the MTJ structure 40 of FIG. 4A.

Referring to FIG. 5A, a magnetization direction of an MTJ structure 50 is perpendicular to a tunnel layer 52, and thus, a direction in which a current flows and an easy magnetization axis may be parallel or substantially parallel to each other. As such, a structure in which a magnetization direction is perpendicular to the tunnel layer 52 is referred to as a perpendicular MTJ structure.

The perpendicular MTJ structure 50 also includes a pinned layer 51, the tunnel layer 52, and a free layer 53. Also, since a magnetization direction of the free layer 53 and a magnetization direction of the pinned layer 51 are parallel to each other, a resistance value may be reduced. When the magnetization direction of the free layer 53 and the magnetization direction of the pinned layer 51 are anti-parallel to each other, a resistance value may be increased. Accordingly, data may be stored in the perpendicular MTJ structure 50 according to a resistance value.

In order to form the perpendicular MTJ structure 50, the free layer 53 and the pinned layer 51 may be formed of a material having relatively high magnetic anisotropic energy. Examples of the material having relatively high magnetic anisotropic energy include an amorphous rare earth element alloy, a multi-layer thin film such as $(Co/Pt)_n$ or $(Fe/Pt)_n$, an ordered lattice material having a L10 crystal structure, etc. For example, the free layer 53 may be formed of an ordered alloy and may include at least one of iron (Fe), cobalt (Co), nickel (Ni), palladium (Pa), platinum (Pt), and the like. Alternatively, the free layer 53 may include at least one of a Fe—Pt alloy, a Fe—Pd alloy, a Co—Pd alloy, a Co—Pt alloy, a Fe—Ni—Pt alloy, a Co—Fe—Pt alloy, a Co—Ni—Pt alloy, and the like. Chemical quantitative expressions of the above alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$.

The pinned layer 51 may also be formed of an alloy and may include at least one of Fe, Co, Ni, Pa, Pt, and the like. For example, the pinned layer 51 may include at least one of a Fe—Pt alloy, a Fe—Pd alloy, a Co—Pd alloy, a Co—Pt alloy, a Fe—Ni—Pt alloy, a Co—Fe—Pt alloy, a Co—Ni—Pt alloy, and the like. Chemical quantitative expressions of the above alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$.

The tunnel layer 52 may include a non-magnetic material. For example, the tunnel layer 52 may include at least one selected from oxides of magnesium (Mg), titanium (Ti), aluminum (Al), magnesium-zinc (MgZn), and magnesium-boron (MgB), nitrides of titanium (Ti) and vanadium (V), and the like. The tunnel layer 52 may have a thickness that is less than a spin diffusion distance.

Referring to FIG. 5B, an MTJ structure 60 is a dual MTJ structure in which a tunnel layer and a pinned layer are at both ends of a free layer, in particular, a perpendicular dual MTJ structure in which perpendicular magnetization is expected.

The perpendicular dual MTJ structure 60 may include a first pinned layer 61, a first tunnel layer 62, a free layer 63, a second tunnel layer 64, and a second pinned layer 65. A material of the first and second pinned layers 61 and 65 may be similar or substantially similar to that of the pinned layer 51 of FIG. 5A, a material of the first and second tunnel layers 62 and 64 may be similar or substantially similar to that of the tunnel layer 52 of FIG. 5A, and a material of the free layer 63 may be similar or substantially similar to that of the free layer 53 of FIG. 5A.

In this case, when a magnetization direction of the first pinned layer 61 and a magnetization direction of the second pinned layer 65 are fixed to be opposite to each other, magnetic forces of the first and second pinned layers 61 and 65 may be offset or substantially offset. Accordingly, the perpendicular dual MTJ structure 60 may perform a read operation by using a smaller amount of current than that of a typical MTJ device. Also, the perpendicular dual MTJ structure 60 may obtain a more accurate data value during a read operation by providing a relatively high resistance.

FIGS. 6A through 10B are plan views of semiconductor devices according to example embodiments. For convenience of explanation, the description already made with reference to FIGS. 1A through 2 will be briefly given or omitted.

Figure 6A:
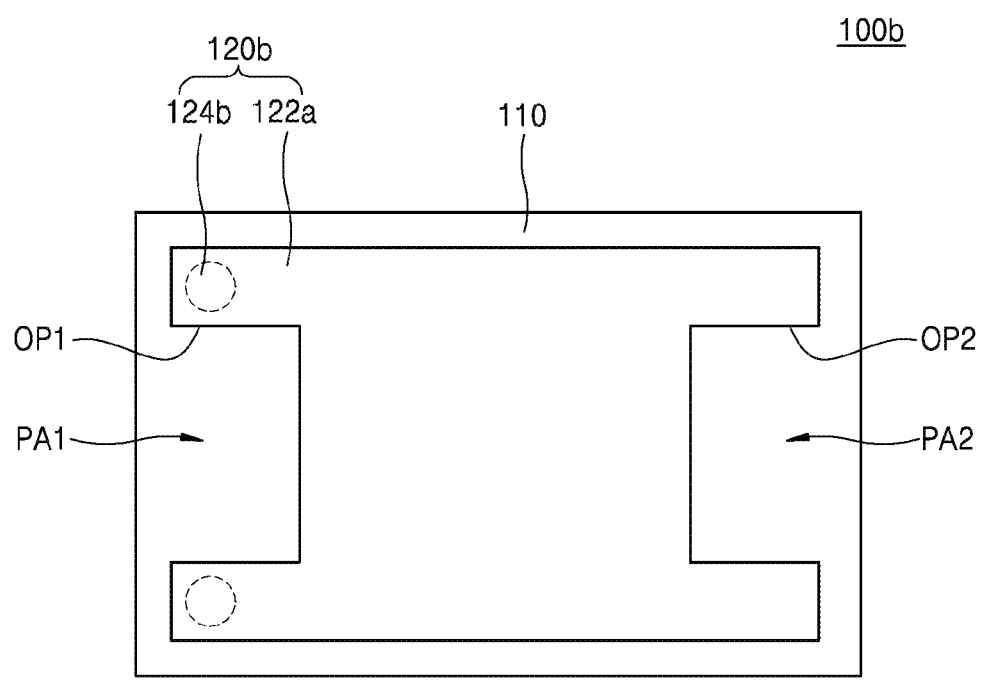
FIGS. 6A through 10B are plan views of semiconductor devices according to example embodiments.

Referring to FIG. 6A, a semiconductor device 100b is similar to the semiconductor device 100 of FIG. 1A, except with regard to a structure of a magnetic shielding layer 120b. In the semiconductor device 100b, an upper shielding layer 122a of the magnetic shielding layer 120b may include first and second open areas OP1 and OP2 on respective sides. In more detail, for example, the upper shielding layer 122a may include the first open area OP1 that exposes a first pad area PA1 on the left side of the MRAM chip 110 and the second open area OP2 that exposes a second pad area PA2 on the right side of the MRAM chip 110.

A via shielding layer 124b may be formed to have a circular cylindrical shape. Alternatively, the via shielding layer 124b may be formed to have a quadrangular pillar shape, like the via shielding layer 124 of the semiconductor device 100 of FIG. 1A, or any of other pillar shapes. A bottom surface of the via shielding layer 124b may be on the same or substantially the same plane as a bottom surface of the MRAM chip 110, or may protrude from the bottom surface of the MRAM chip 110

The MRAM chip 110 may be similar or substantially similar to the MRAM chip 110 of the semiconductor device 100 of FIG. 1A in terms of an outer appearance. However, since the MRAM chip 110 includes the second pad area PA2 on the right side, the MRAM chip 110 may be different from the MRAM chip 110 of the semiconductor device 100 of FIG. 1A in a structure of an internal wiring layer. A material of the magnetic shielding layer 120b and/or a method of forming the magnetic shielding layer 120b may be the same or substantially the same as that described above.

Figure 6B:
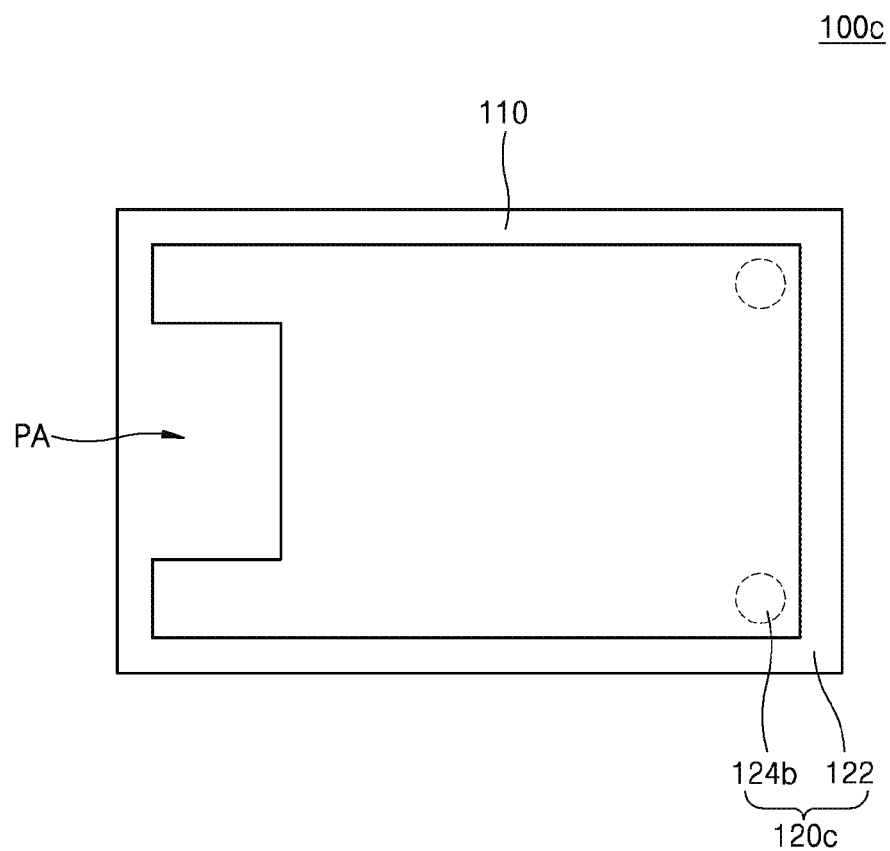

Referring to FIG. 6B, a semiconductor device 100c may be similar or substantially the same as the semiconductor device 100 of FIG. 1A except for a position and a shape of the via shielding layer 124b. In the semiconductor device 100c, the via shielding layer 124b may be formed to have a circular cylindrical shape and may be on a side opposite to a side including the pad area PA. In other words, a position of the via shielding layer 124b is not limited to a position around the pad area PA, and may be more freely selected if necessary. Also, a shape of the via shielding layer 124b is not limited to a circular cylindrical shape. A material of a magnetic shielding layer 120c and/or a method of forming the magnetic shielding layer 120c may be the same or substantially the same as that described above.

Figure 7:
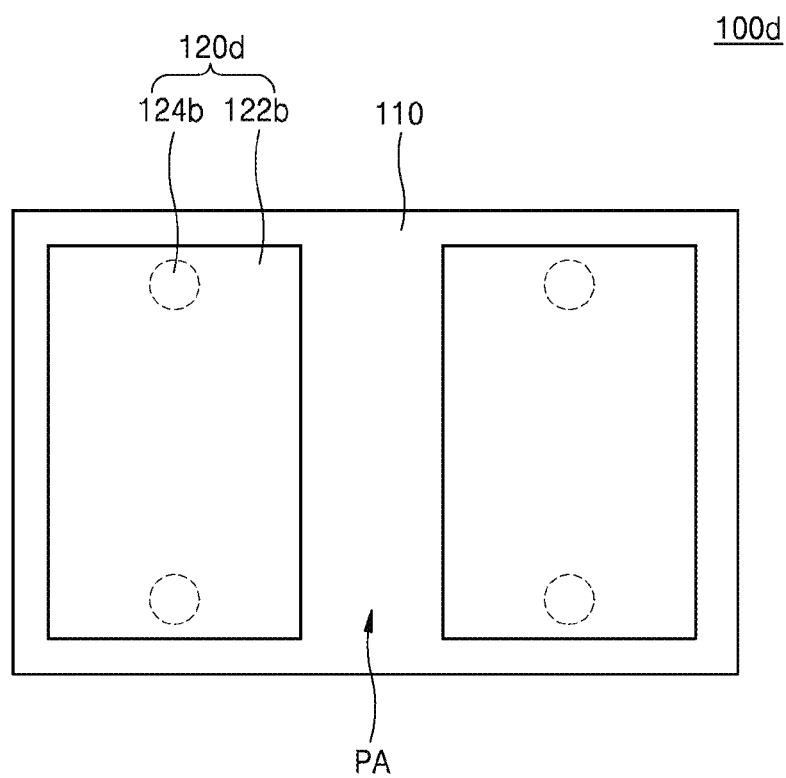

Referring to FIG. 7, a semiconductor device 100d may be similar to the semiconductor device 100 of FIG. 1A, except in a structure of a magnetic shielding layer 120d. In the semiconductor device 100d, an upper shielding layer 122b may be at each side of the MRAM chip 110, and a central portion (e.g., the pad area PA) of the MRAM chip 110 between the upper shielding layers 122b may be exposed.

The via shielding layer 124b having a circular cylindrical shape may be formed in portions of the MRAM chip 110 on which each of the two upper shielding layers 122b are formed. A shape of the via shielding layer 124b is not limited to a circular cylindrical shape. Also, although the MRAM chip 110 is similar to the MRAM chip 110 of the semiconductor device 100 of FIG. 1A in terms of an outer appearance, the MRAM chip 110 of FIG. 7 includes the pad area PA at its central portion, and thus, may be different from the MRAM chip 110 of the semiconductor device 100 of FIG. 1A in a structure of an internal wiring layer. A material of the magnetic shielding layer 120d and/or a method of forming the magnetic shielding layer 120d may be the same or substantially the same as that described above.

Figure 8:
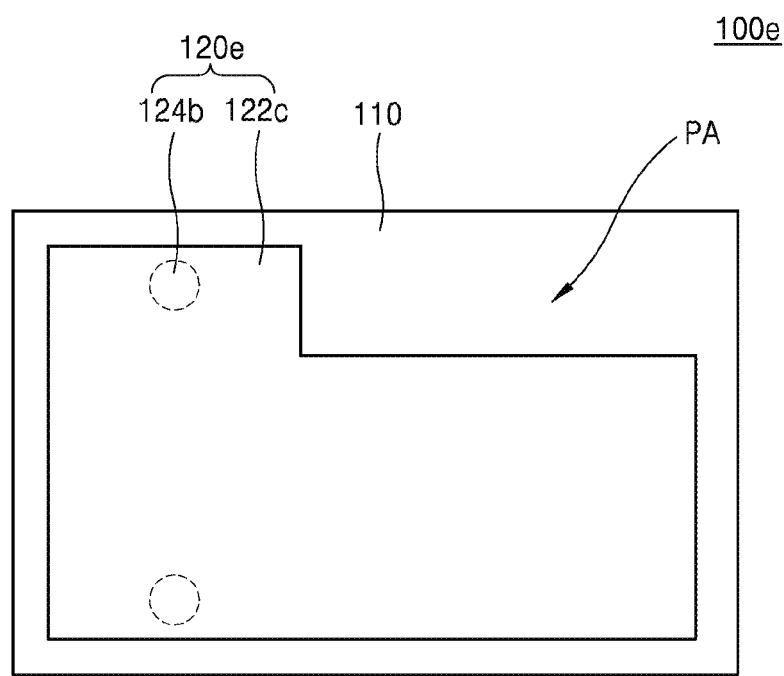

Referring to FIG. 8, a semiconductor device 100e may be similar to the semiconductor device 100 of FIG. 1A, except in a structure of a magnetic shielding layer 120e. For example, in the semiconductor device 100e, an upper shielding layer 122c may cover a top surface of the MRAM chip 110 and expose the pad area PA on a right upper portion of the MRAM chip 110. A material of the magnetic shielding layer 120e, a method of forming the magnetic shielding layer 120e, and/or a structure of an internal wiring layer of the MRAM chip 110, may be the same or substantially the same as that described above.

Figure 9:
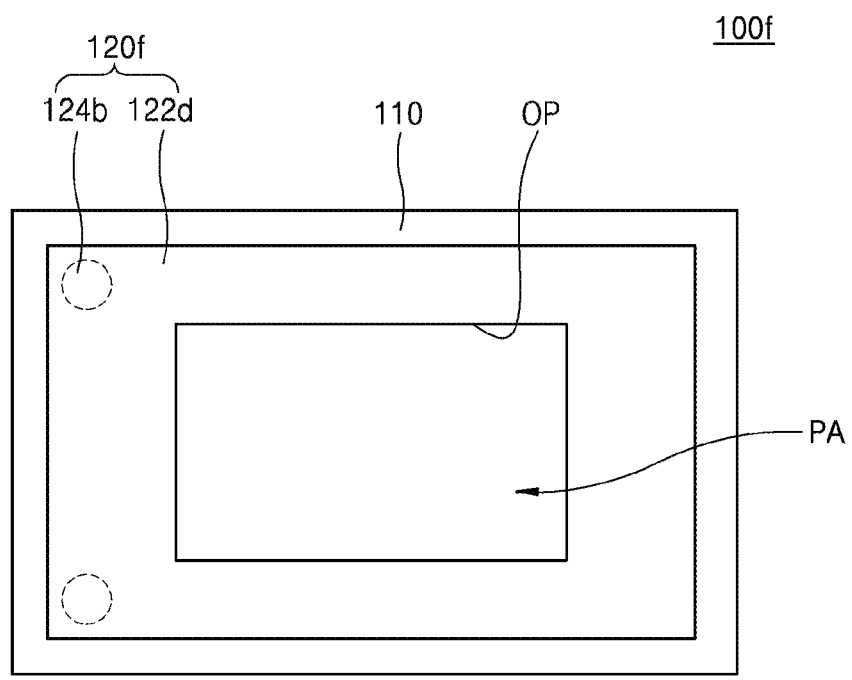

Referring to FIG. 9, a semiconductor device 100f may be similar to the semiconductor device 100 of FIG. 1A, except in a structure of a magnetic shielding layer 120f. For example, in the semiconductor device 100f, an upper shielding layer 122d may cover a top surface of the MRAM chip 110 and expose the pad area PA at a central portion of the MRAM chip 110. In at least this example embodiment, the upper shielding layer 122d may surround the pad area PA and may include the open area OP that exposes the pad area PA. A material of the magnetic shielding layer 120f, a method of forming the magnetic shielding layer 120f, and/or a structure of an internal wiring layer of the MRAM chip 110, may be the same or substantially the same as that described above.

Figure 10A:
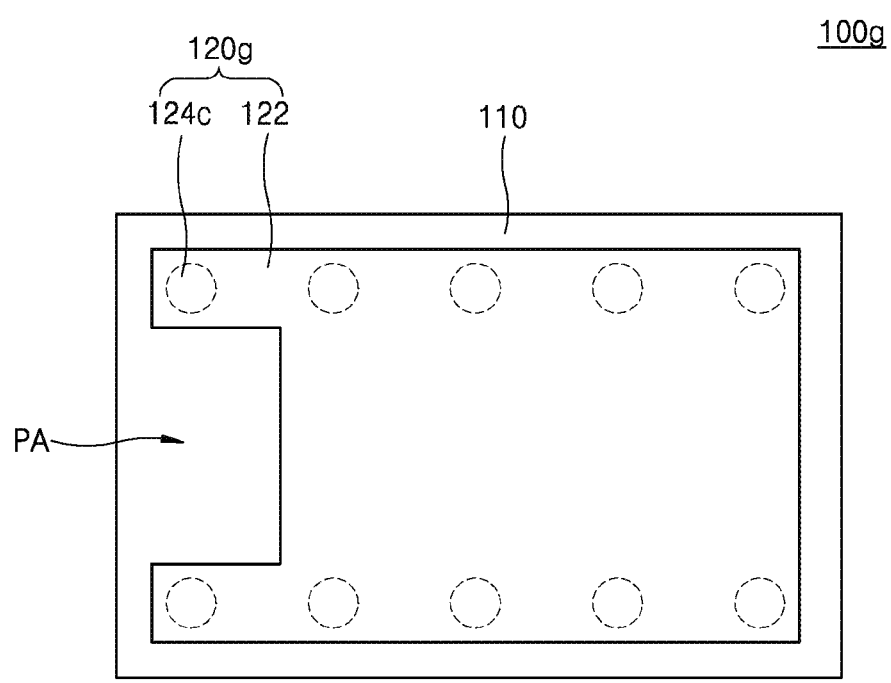

Referring to FIG. 10A, a semiconductor device 100g may be similar to the semiconductor device 100 of FIG. 1A, except for an arrangement and the number of via shielding layers 124c. In the semiconductor device 100g, a plurality of the via shielding layers 124c may be formed along at least one outer portion (e.g., two, opposite outer length-wise edges) of the MRAM chip 110. Although the plurality of via shielding layers 124c are formed along an upper side and a lower side of the MRAM chip 110, example embodiments are not limited thereto. Rather, the plurality of via shielding layers 124c may be formed along only one side. Alternatively, the via shielding layers 124c may be formed along a side closer to the pad area PA. Each of the plurality of via shielding layer 124c may be connected to the upper shielding layer 122. A material of a magnetic shielding layer 120g and/or a method of forming the magnetic shielding layer 120g may be the same or substantially the same as that described above.

Figure 10B:
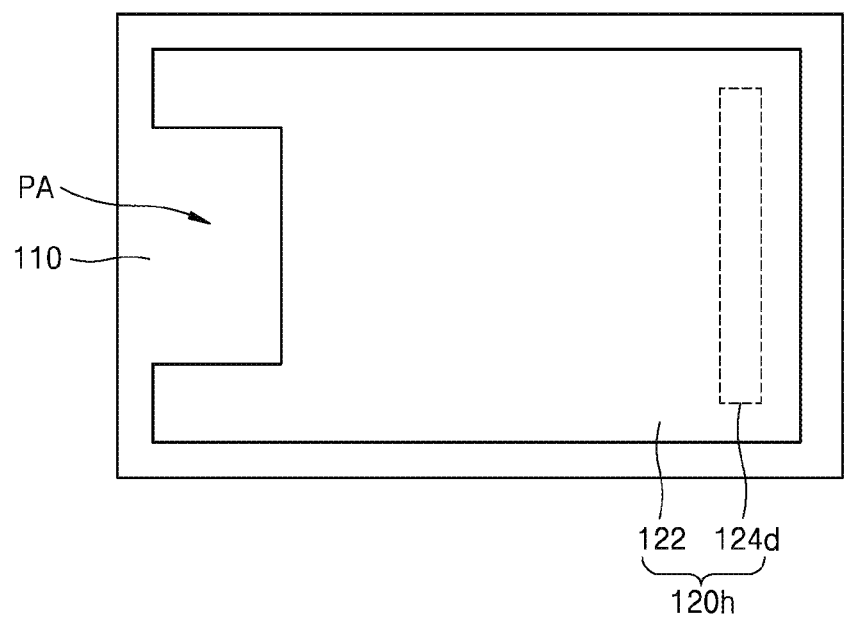

Referring to FIG. 10B, a semiconductor device 100h may be similar to the semiconductor device 100 of FIG. 1A, except for a structure of a via shielding layer 124d. In the semiconductor device 100h, the via shielding layer 124d may be continuously formed to have a side wall shape or a dam shape along a right side of the MRAM chip 110. In more detail, for example, a horizontal cross-section of the via shielding layer 124d may have a rectangular shape that extends in one direction as marked with a dashed line, and a vertical cross-section of the via shielding layer 124d may have a rectangular shape, like the via shielding layer 124 of FIG. 1B. In at least this example embodiment, the hole in which the via shielding layer 124d is formed may have an elongated edge in a direction parallel to an edge of the semiconductor device.

The via shielding layer 124d having a side wall shape may be formed on an upper side or a lower side of the MRAM chip 110, instead of the right side, or on a side closer to the pad area PA. Alternatively, the via shielding layer 124d having a side wall shape may surround the upper side and the lower side of the MRAM chip 110 as well as the right side. Furthermore, the via shielding layer 124d may also surround the side closer to the pad area PA. A material of a magnetic shielding layer 120h and/or a method of forming the magnetic shielding layer 120h may be the same or substantially the same as that described above.

As described with reference to FIGS. 6B, 10A, and 10B, a via shielding layer may be formed to have any of various structures and any of various positions in any of various numbers if necessary. Although the via shielding layer is generally connected to an upper shielding layer, the via shielding layer may not be connected to the upper shielding layer and may be independently formed if necessary.

Figure 11A:
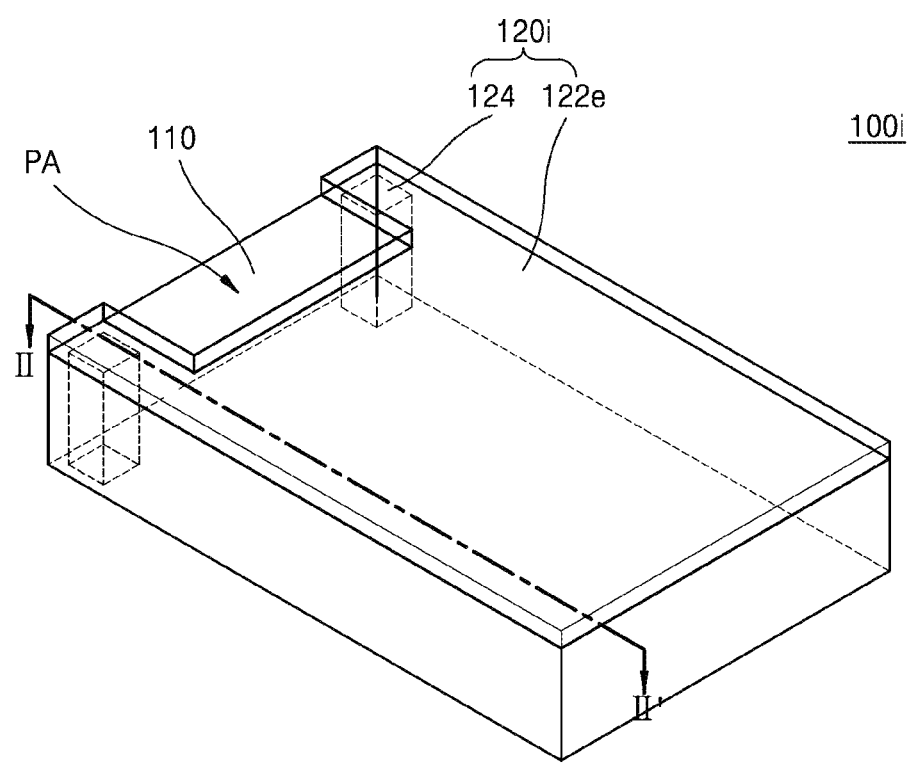
FIG. 11A is a perspective view of a semiconductor device according to an example embodiment.
Figure 11B:
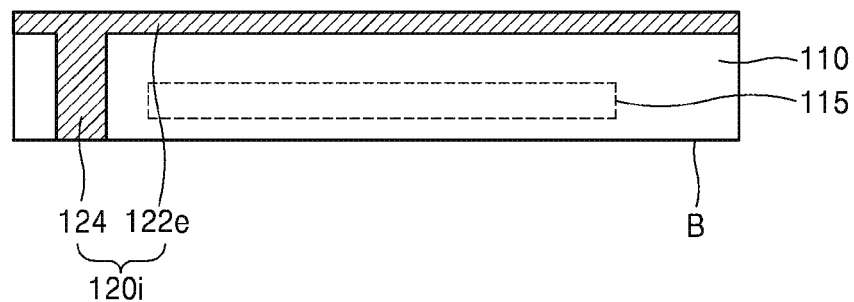
FIG. 11B is a cross-sectional view taken along line II-IT in FIG. 11A.

FIG. 11A is a perspective view of a semiconductor device 100i according to another example embodiment. FIG. 11B is a cross-sectional view taken along line II-IT in FIG. 11A. For convenience of explanation, the description already made with reference to FIGS. 1A through 10B will be only briefly given or omitted.

Referring to FIGS. 11A and 11B, the semiconductor device 100*i* is similar to the semiconductor device 100 of FIG. 1A, except in a structure of an upper shielding layer 122*e*. In the semiconductor device 100*i*, the upper shielding layer 122*e* may cover an entire top surface of the MRAM chip 110 except for the pad area PA of the MRAM chip 110. In other words, for example, the upper shielding layer 122*e* may cover even an outer area corresponding to a scribe lane. According to at least this example embodiment, a scribe lane on an upper surface of the MRAM chip 110 is omitted.

The upper shielding layer 122*e* having this structure may be selected when the existence of the upper shielding layer 122*e* does not greatly affect a sawing process to singulate the semiconductor device 100*i*. Since an additional patterning process is not performed on a scribe lane area, a patterning process of the upper shielding layer 122*e* may be simplified. A material of a magnetic shielding layer 120*i* and/or a method of forming the magnetic shielding layer 120*i* may be the same or substantially the same as that described above.

Figure 12A:
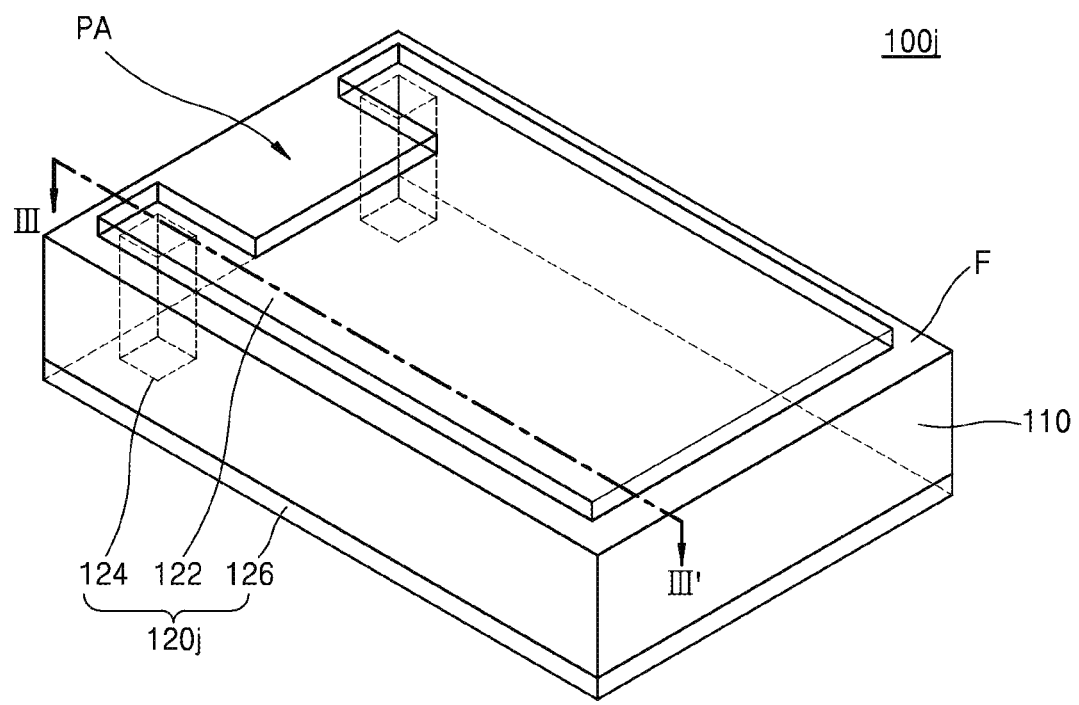
FIG. 12A is a perspective view of a semiconductor device according to an example embodiment.
Figure 12B:
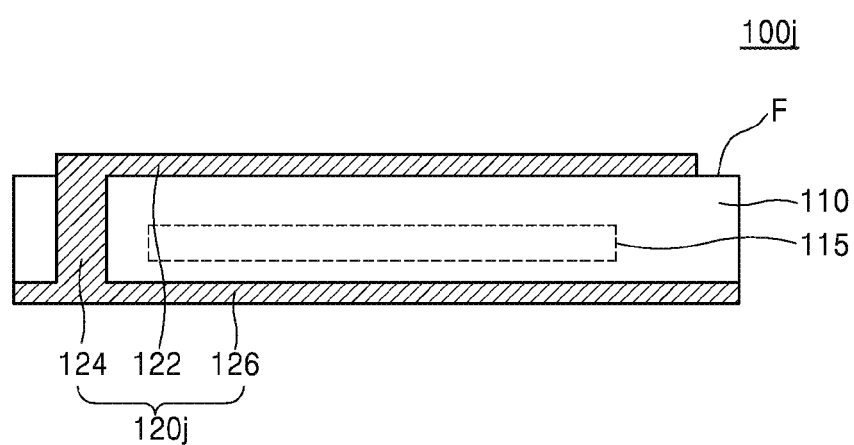
FIG. 12B is a cross-sectional view taken along line III-III' in FIG. 12A.

FIG. 12A is a perspective view of a semiconductor device 100*j* according to another example embodiment. FIG. 12B is a cross-sectional view taken along line in FIG. 12A. For convenience of explanation, the description already made with reference to FIGS. 1A through 11B will be briefly given or omitted.

Referring to FIGS. 12A and 12B, the semiconductor device 100*j* may be different from the semiconductor devices of the above example embodiments in a structure of a magnetic shielding layer 120*j*. In the semiconductor device 100*j*, the magnetic shielding layer 120*j* may include the upper shielding layer 122, the via shielding layer 124, and a lower shielding layer 126.

The lower shielding layer 126 may cover an entire bottom surface of the MRAM chip 110. The lower shielding layer 126 may be connected to the upper shielding layer 122 through the via shielding layer 124. Connection through the via shielding layer 124 may refer to physical and magnetic connection. Hereinafter, connection between upper and lower shielding layers through a via shielding layer may refer to physical and magnetic connection.

Since the lower shielding layer 126 having this structure is formed and is connected through the via shielding layer 124, a magnetic shielding layer 120*j* may form a U-shaped or ⊏~-shaped ferromagnetic shielding structure. Accordingly, when a semiconductor package is to be formed, an additional ferromagnetic shielding layer need not be formed on a package substrate.

Since a pad is not disposed on the bottom surface of the MRAM chip 110, the lower shielding layer 126 need not include an open area that exposes a pad area. However, the lower shielding layer 126 may be formed to expose an outer portion of the MRAM chip 110 corresponding to a scribe lane. Since the lower shielding layer 126 is formed in this manner, a sawing process for singulating the semiconductor device 100*j* may be more easily performed.

A material of the upper shielding layer 122 and the via shielding layer 124 and/or a method of forming the upper shielding layer 122 and the via shielding layer 124 may be the same or substantially the same as that described above. The lower shielding layer 126 may also be formed of a ferromagnetic material, and a material of the lower shielding layer 126 and/or a method of forming the lower shielding layer 126 may be the same or substantially the same as that described for the upper shielding layer 122 and the via shielding layer 124.

Figure 13A:
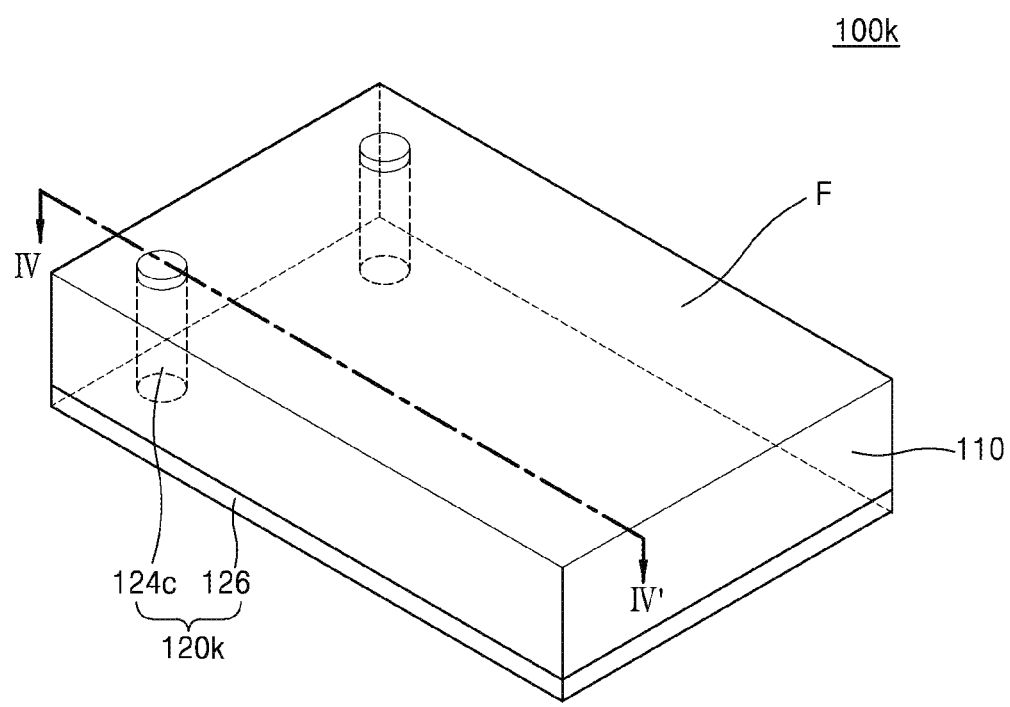
FIG. 13A is a perspective view of a semiconductor device according to an example embodiment.
Figure 13B:
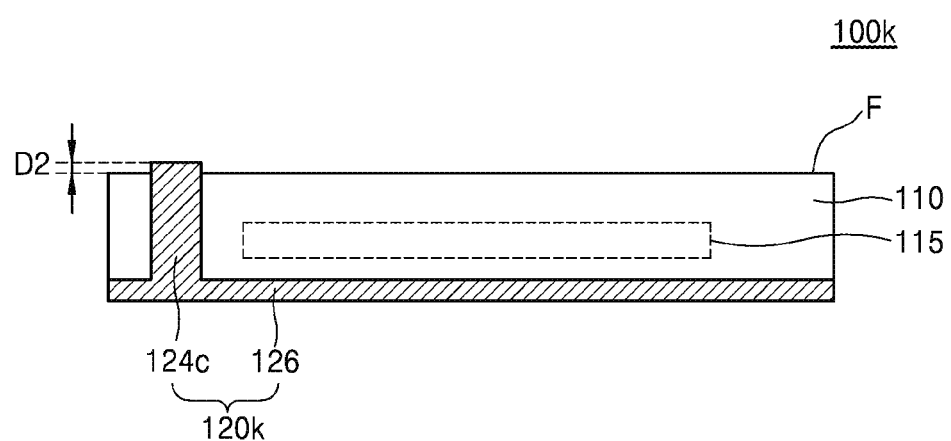
FIG. 13B is a cross-sectional view taken along line IV-IV' in FIG. 13A.

FIG. 13A is a perspective view of a semiconductor device 100*k* according to another example embodiment. FIG. 13B is a cross-sectional view taken along line IV-IV' in FIG. 13A. For convenience of explanation, the description already made with reference to FIGS. 1A through 12B will be only briefly given or omitted.

Referring to FIGS. 13A and 13B, the semiconductor device 100*k* may be different (e.g., substantially or completely different) from the semiconductor device 100 of FIG. 1A in a structure of a magnetic shielding layer 120. In the semiconductor device 100*k*, a magnetic shielding layer 120*k* may include the via shielding layer 124*c* and the lower shielding layer 126. The magnetic shielding layer 120*k* may not include an upper shielding layer, unlike in the above-described example embodiments.

The lower shielding layer 126 may cover an entire bottom surface of the MRAM chip 110 as described with reference to FIGS. 12A and 12B. However, if necessary, the lower shielding layer 126 may expose an outer portion corresponding to a scribe lane.

The via shielding layer 124*c* may extend upward from the lower shielding layer 126 and may pass through the MRAM chip 110. Also, a top surface of the via shielding layer 124*c* may protrude from the front surface F of the MRAM chip 110. The front surface F of the MRAM chip 110 is an active surface as described above. Accordingly, although not shown in FIGS. 13A and 13B, a plurality of pads may be on the front surface F of the MRAM chip 110. The plurality of pads may be used to stack the semiconductor device 100*k* on a package substrate (e.g., 200*c* of FIG. 24A) by using flip-chip bonding.

A second thickness D2 of a protrusion of the via shielding layer 124*c* from the front surface F of the MRAM chip 110 may be appropriately adjusted in consideration of thicknesses of bumps 370 (see FIG. 24A) and a substrate shielding layer 320*b* (see FIG. 24A) when the semiconductor device 100*k* is subsequently stacked on the package substrate by using flip-chip bonding. If necessary, a thickness of the substrate shielding layer 320*b* may be the same or substantially the same as a thickness of the bumps 370. In this case, the top surface of the via shielding layer 124*c* may not protrude from the front surface F of the MRAM chip 110 and may be on the same or substantially the same plane as the front surface F of the MRAM chip 110. A material of the magnetic shielding layer 120*k* or a method of forming the magnetic shielding layer 120*k* is the same or substantially the same as that described above.

Figure 14A:
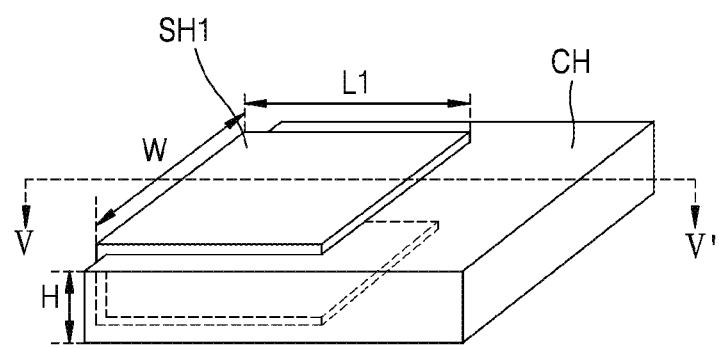
FIG. 14A is a perspective view of an example embodiment of a virtual semiconductor device including a U-shaped magnetic shielding layer structure.
Figure 14B:
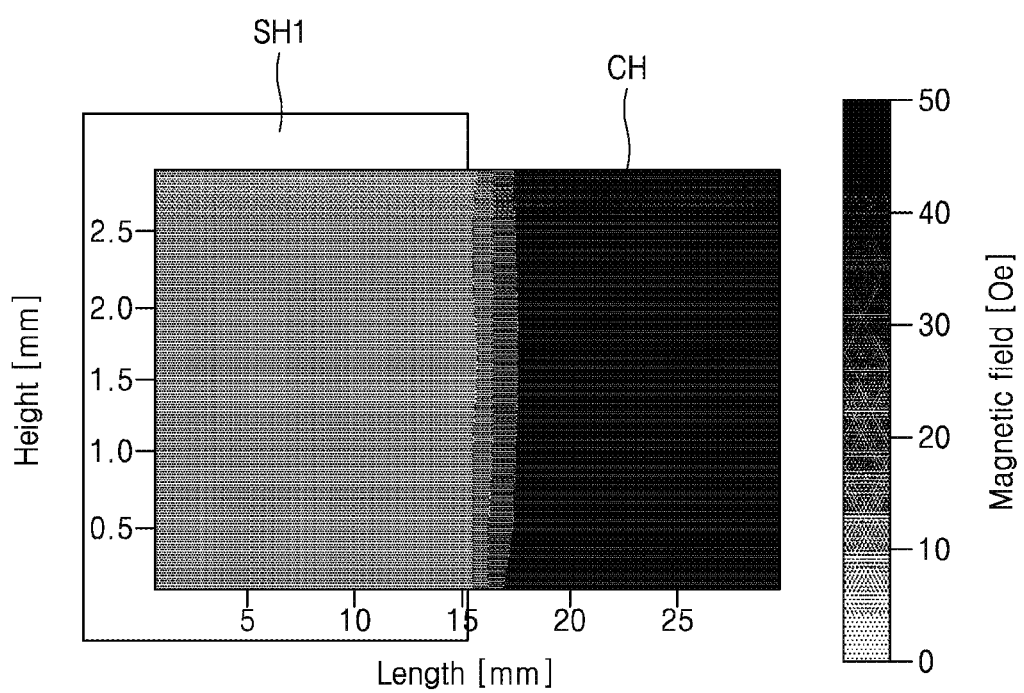
FIG. 14B is a cross-sectional view for explaining an example embodiment of a magnetic field shielding effect in the virtual semiconductor device of FIG. 14A.

FIG. 14A is a perspective view of an example embodiment of a virtual semiconductor device including a U-shaped magnetic shielding layer structure. FIG. 14B is a cross-sectional view taken along line V-V' in FIG. 14A for explaining an example magnetic field shielding effect in the virtual semiconductor device of FIG. 14A when a uniform or substantially uniform external perpendicular magnetic field is applied. A first length L1 of a U-shaped magnetic shielding layer SH1 is about 15 mm, a width W of the U-shaped magnetic shielding layer SH1 is about 30 mm, a thickness of the U-shaped magnetic shielding layer SH1 is about 1 mm, and a height H of a virtual MRAM chip CH is about 3 mm.

Referring to FIGS. 14A and 14B, when the U-shaped magnetic shielding layer SH1 is formed on the virtual MRAM chip CH and an external perpendicular magnetic field of about 50 Oe is applied, a strength of a magnetic field formed in an inner portion surrounded by the U-shaped magnetic shielding layer SH1 is relatively low (e.g., very low). In one example, a strength of a magnetic field detected at a portion of the virtual MRAM chip CH surrounded by the U-shaped magnetic shielding layer SH1 is less than or equal to about 30 Oe, a strength of a magnetic field detected at a boundary portion is about 30 Oe, and a strength of a magnetic field detected at a portion of the virtual MRAM chip CH not surrounded by the U-shaped magnetic shielding layer SH1 is similar or substantially similar to that of the external perpendicular magnetic field. That is, for example, the U-shaped magnetic shielding layer SH1 has a relatively high effect of shielding the external perpendicular magnetic field. Also, since a strength of a magnetic field gradually decreases inward, an effect of shielding the external perpendicular magnetic field when the U-shaped magnetic shielding layer SH1 is formed to entirely cover the virtual MRAM chip CH is higher than that when the U-shaped magnetic shielding layer SH1 is formed to partially cover the virtual MRAM chip CH.

Figure 15A:
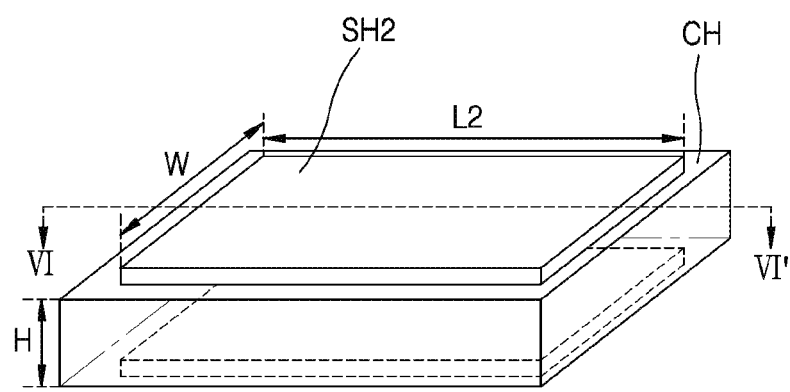
FIG. 15A is a perspective view of a virtual semiconductor device including a plate-shaped magnetic shielding layer structure.
Figure 15B:
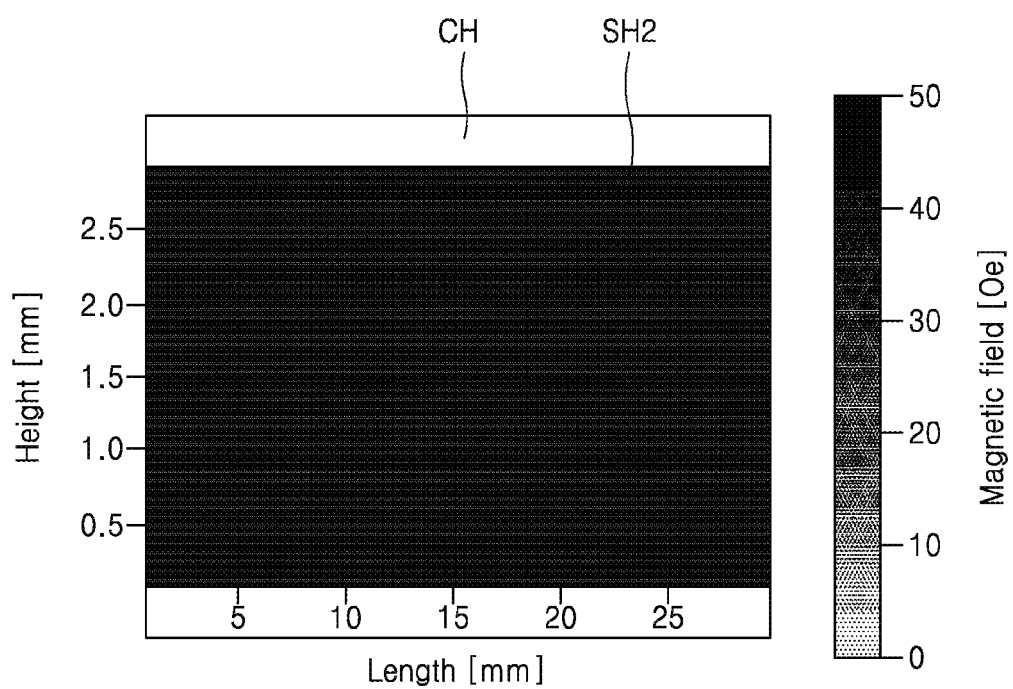
FIG. 15B is a cross-sectional view for explaining an example magnetic field shielding effect in the virtual semiconductor device of FIG. 15A.

FIG. 15A is a perspective view of an example embodiment of a virtual semiconductor device including a plate-shaped magnetic shielding layer structure. FIG. 15B is a cross-sectional view taken along line VI-VI' in FIG. 15A for explaining an example magnetic field shielding effect in the virtual semiconductor device of FIG. 15A when a uniform or substantially uniform external perpendicular magnetic field is applied. A second length L2 of each of upper and lower plate-shaped magnetic shielding layers SH2 is about 30 mm, a width W of each of the upper and lower plate-shaped magnetic shielding layers SH2 is about 30 mm, a thickness of each of the upper and lower plate-shaped magnetic shielding layers SH2 is about 1 mm, and a height H of the virtual MRAM chip CH is about 3 mm.

Referring to FIGS. 15A and 15B, when the upper and lower plate-shaped magnetic shielding layers SH2 are respectively formed on a top surface and a bottom surface of the virtual MRAM chip CH and an external perpendicular magnetic field of about 50 Oe is applied, a strength of a magnetic field formed in an inner portion of the virtual MRAM chip CH between the upper and lower plate-shaped magnetic shielding layers SH2 is relatively high (e.g., very high). In one example, a strength of a magnetic field detected at a portion of the virtual MRAM chip CH between the upper and lower plate-shaped magnetic shielding layers SH2 is greater than or equal to about 50 Oe. That is, the upper and lower plate-shaped magnetic shielding layers SH2 have relatively little (e.g., very little) effect of shielding an external perpendicular magnetic field.

For reference, in a perpendicular MRAM structure, when a direction of an external magnetic field is horizontal, which is perpendicular to a magnetization direction of a magnetic layer, it is relatively difficult to change a magnetization direction of the perpendicular MRAM through a side surface of a MRAM chip. Accordingly, the perpendicular MRAM may not be greatly affected by an external horizontal magnetic field. However, when a direction of an external magnetic field is vertical, which is the same as a magnetization direction of a magnetic layer, a magnetization direction of a MRAM may be likely to be changed through a side surface of a MRAM chip. Accordingly, in the perpendicular MRAM, in order to maintain relatively high reliability, it may be necessary to form a shielding layer that may shield the effect of an external perpendicular magnetic field.

As described above, a magnetic shielding layer having a U-shaped magnetic shielding layer structure that surrounds a top surface, a bottom surface, and a side surface of a MRAM chip may be improved relative to a magnetic shielding layer having a plate-shaped magnetic shielding layer structure that covers only a top surface and a bottom surface of a MRAM chip. Accordingly, the magnetic shielding layer in semiconductor devices according to one or more example embodiments may be formed to have a U-shaped structure and to surround the MRAM chip (e.g., the entire MRAM chip).

Figure 16A:
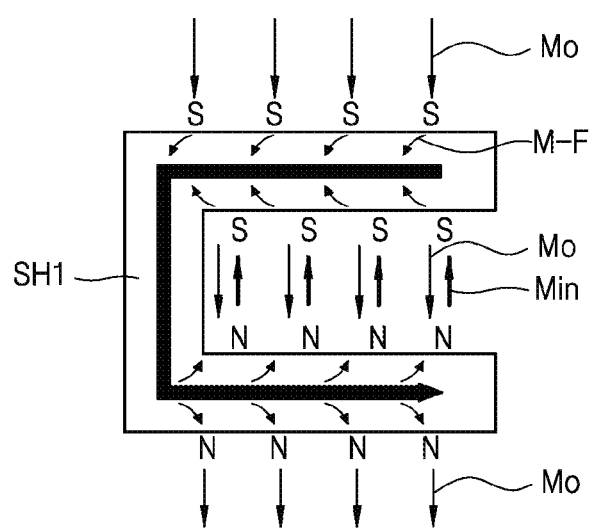
FIGS. 16A and 16B are conceptual views for explaining magnetic field shielding effects in a U-shaped magnetic shielding layer structure and a plate-shaped magnetic shielding layer structure, respectively.
Figure 16B:
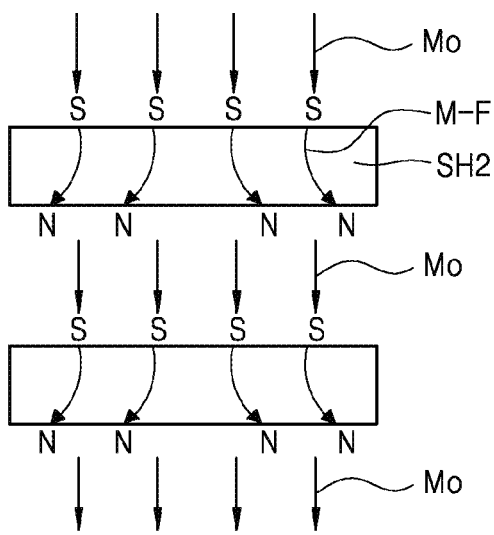

FIGS. 16A and 16B are conceptual views for explaining an example magnetic field shielding effect respectively in a U-shaped magnetic shielding layer structure and a plate-shaped magnetic shielding layer structure.

Referring to FIG. 16A, it is assumed that an external magnetic field Mo is applied from top to bottom to the U-shaped magnetic shielding layer SH1 as shown in FIG. 16A. When the U-shaped magnetic shielding layer SH1 is formed of a ferromagnetic material, polarities (e.g., polarities of a horseshoe magnet) may be induced due to the external magnetic field Mo. That is, for example, an upper layer may have an S polarity and a lower layer may have an N polarity. Due to the polarities, an induced magnetic field Min is formed between the S polarity of the upper layer and the N polarity of the lower layer. The induced magnetic field Min cancels or substantially cancels the external magnetic field Mo between the upper layer and the lower layer. As a result, due to the U-shaped magnetic shielding layer structure, the effect of the external magnetic field Mo in the U-shaped magnetic shielding layer structure may be suppressed and/or effectively blocked.

For reference, an arrow marked in the U-shaped magnetic shielding layer SH1 denotes a magnetic flux M-F flowing in the U-shaped magnetic shielding layer SH1.

Referring to FIG. 16B, it is assumed that the external magnetic field Mo is applied from top to bottom to the upper and lower plate-shaped magnetic shielding layers SH2 as shown in FIG. 16B. When the upper and lower plate-shaped magnetic shielding layers SH2 are formed of a ferromagnetic material, polarities may be induced due to the external magnetic field Mo. That is, for example, an S polarity may be induced on a top surface of the upper plate-shaped magnetic shielding layer SH2 and an N polarity may be induced on a bottom surface of the upper plate-shaped magnetic shielding layer SH2. Also, an S polarity may be induced on a top surface of the lower plate-shaped magnetic shielding layer SH2 and an N polarity may be induced on a bottom surface of the lower plate-shaped magnetic shielding layer SH2. Due to the polarities, an induced magnetic field having the same direction as that of the external magnetic field Mo may be formed between the upper plate-shaped magnetic shielding layer SH2 and the lower plate-shaped magnetic shielding layer SH2. As a result, the magnetic field between the upper plate-shaped magnetic shielding layer SH2 and the lower plate-shaped magnetic shielding layer SH2 may be greater than the external magnetic field Mo. The result matches a measurement result of FIG. 15B. Accordingly, it is found that the upper and lower plate-shaped magnetic shielding layers SH2 provide relatively little shielding effect on an external perpendicular magnetic field.

Figure 17:
FIG. 17 is a table numerically showing example magnetic field shielding effects of various magnetic shielding layer structures.
Figure 17:
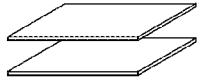
Figure 17:
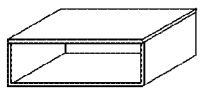
Figure 17:
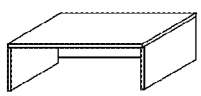

FIG. 17 is a table numerically showing example magnetic field shielding effects of various magnetic shielding layer structures, including a magnetic shielding layer structure according to one or more example embodiments. A name of a magnetic shielding layer structure is shown in a first column, a strength of a magnetic field simulated at an inner comparative point Hin when an external perpendicular magnetic field of about 50 Oe is applied is shown in a second column, and an image corresponding to the magnetic shielding structure is shown in a third column.

Referring to FIG. 17, it is found that magnetic field shielding effects of magnetic shielding layers having a U-shaped structure and a cylinder-shaped structure are numerically high. The reason why the U-shaped structure and the cylinder-shaped structure effectively shield an external perpendicular magnetic field may be inferred from the description of FIG. 16A. That is, for example, in the U-shaped structure and the cylinder-shaped structure, polarities (e.g., polarities of a horseshoe magnet) may be induced when an external perpendicular magnetic field is applied. Accordingly, the external perpendicular magnetic field may be cancelled and shielded in the U-shaped structure and the cylinder-shaped structure.

However, it is numerically found that in a plate-shaped structure or a cover-shaped structure, since such polarities are not induced, an external perpendicular magnetic field is shielded relatively little.

Figure 18A:
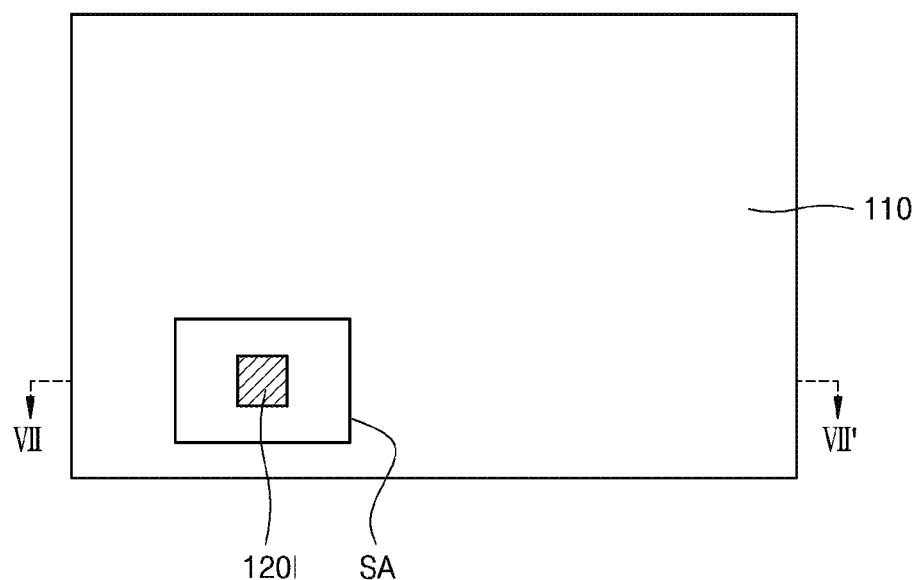
FIG. 18A is a perspective view of a semiconductor device according to an example embodiment.
Figure 18B:
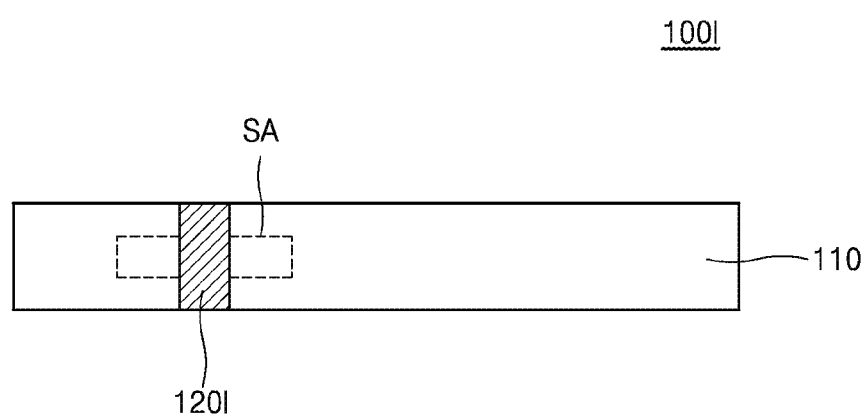
FIG. 18B is a cross-sectional view taken along line VII-VII' in FIG. 18A.

FIG. 18A is a perspective view of a semiconductor device 100l according to an example embodiment. FIG. 18B is a cross-sectional view taken along line VII-VII' in FIG. 18A. For convenience of explanation, the description already made with reference to FIGS. 1A through 13B will be only briefly given or omitted.

Referring to FIGS. 18A and 18B, the semiconductor device 100l may be different (e.g., substantially or completely different) from the semiconductor device 100 of FIG. 1A in a structure of a magnetic shielding layer 120l. In the semiconductor device 100l, the magnetic shielding layer 120l may include only a via structure. In more detail, in the semiconductor device 100l, the magnetic shielding layer 120l corresponds to the via shielding layer of any of the above-described example embodiments, and does not include an upper shielding layer or a lower shielding layer.

The magnetic shielding layer 120l may be formed to pass through the MRAM chip 110 at a central portion of a security area SA whose reliability is relatively (e.g., very) important. For example, the semiconductor device 100l may include a perpendicular MRAM only in the security area SA and may include a planar MRAM or another memory in other portions. Also, the reliability of the security area SA may be more important than the reliability of other portions. In this case, the magnetic shielding layer 120l having a structure according to this example embodiment may be formed. When there is a plurality of the security areas SA or the security area SA is relatively large, two or more magnetic shielding layers 120l may be formed.

An example of how the magnetic shielding layer 120l shields an external magnetic field is as follows. It is assumed that an external magnetic field is applied from top to bottom. Like polarities of a horseshoe magnet, an S polarity may be induced on a top surface of the magnetic shielding layer 120l and an N polarity may be induced on a bottom surface of the magnetic shielding layer 120l. Once the S polarity and the N polarity are induced, an induced magnetic field from the N polarity to the S polarity is formed around the magnetic shielding layer 120l. Accordingly, the induced magnetic field suppresses and/or cancels the external magnetic field, thereby shielding the external magnetic field.

Since the magnetic shielding layer 120l is formed only on an area that is to be protected from an external perpendicular magnetic field, a position of the magnetic shielding layer 120l may not be greatly affected by a position of a pad of the MRAM chip 110. Also, since the magnetic shielding layer 120l is rarely formed on an outer portion of the MRAM chip 110, the magnetic shielding layer 120l may not affect a sawing process of singulating the semiconductor device 100l at all. Furthermore, the semiconductor device 100l may not be limited to wire bonding or flip-chip bonding in a package process. Also, an additional shielding layer need not be formed on a package substrate. A material of the magnetic shielding layer 120l and/or a method of forming the magnetic shielding layer 120l may be the same or substantially the same as that described above.

Figure 19:
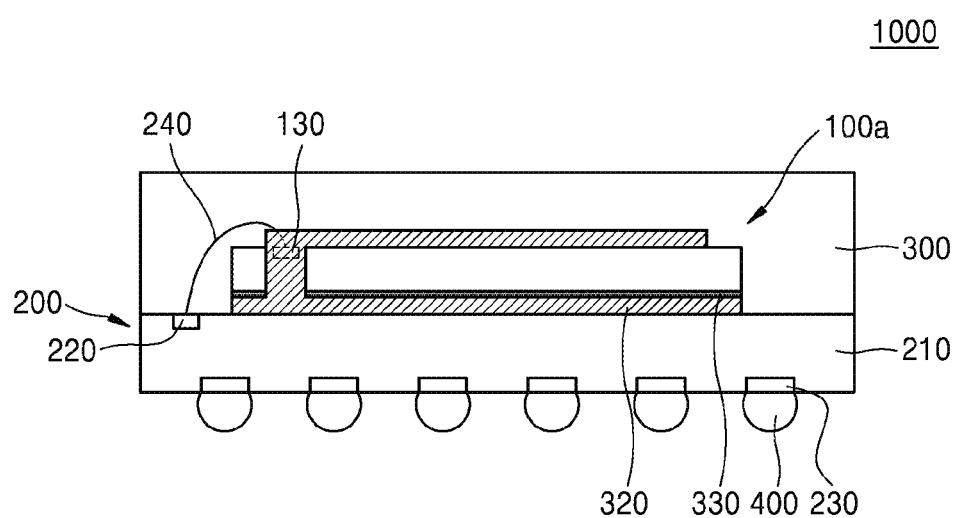
FIG. 19 is a cross-sectional view of a semiconductor package according to an example embodiment.

FIG. 19 is a cross-sectional view of a semiconductor package 1000 according to an example embodiment. For convenience of explanation, the description already made with reference to FIGS. 1A through 18B will be only briefly given or omitted.

Referring to FIG. 19, the semiconductor package 1000 may include the semiconductor device 100a, a package substrate 200, a sealing material 300, a substrate shielding layer 320, and an external connection terminal 400.

The semiconductor device 100a may include the MRAM chip 110 and the magnetic shielding layer 120a as described with reference to FIG. 2. The semiconductor device 100a may be stacked on the package substrate 200 and may be electrically connected to the package substrate 200 through a wire 240. That is, for example, the semiconductor device 100a may be stacked on the package substrate 200 by using wire bonding. The wire 240 electrically connects a chip pad 130 of the MRAM chip 110 to a substrate pad 220 of the package substrate 200.

The package substrate 200, which is a support substrate on which the semiconductor device 100a is stacked, may include a body layer 210, the substrate pad 220, and an external connection pad 230. The package substrate 200 may be formed based on, for example, a ceramic substrate, a printed circuit board (PCB), a glass substrate, and an interposer substrate. If necessary, the package substrate 200 may be formed as an active wafer.

A multi-layer or single-layer wiring pattern (not shown) may be formed in the body layer 210, and the substrate pad 220 and the external connection pad 230 may be electrically connected to each other through the multi-layer or single-layer wiring pattern. Although not shown in FIG. 19, an upper protective layer and a lower protective layer may be respectively formed on a top surface and a bottom surface of the body layer 210, and the substrate pad 220 may be exposed through the upper protective layer and the external connection pad 230 may be exposed through the lower protective layer. The upper protective layer and the lower protective layer may protect the body layer 210 and may be formed of, for example, solder resist.

When the package substrate 200 is a PCB, the body layer 210 may be generally formed as a thin film by compressing a phenolic or epoxy glass (or FR-4) resin to a given (or alternatively, desired or predetermined) thickness and the PCB may be formed by applying a copper foil to both surfaces and then forming a wiring pattern, which is a path through which an electrical signal is transmitted, through patterning. Also, the wiring patterns formed on the upper surface and the bottom surface may be electrically connected to each other through a via contact (not shown) that passes through the body layer 210. The PCB may be classified as a single layer PCB in which a wiring line is formed on one surface or a double layer PCB in which a wiring line is formed on both surfaces. Also, a multi-layer PCB may be formed by forming copper foils as three or more layers by using an insulator such as a prepreg and forming three or more wiring layers according to the number of the copper foil layers. However, in the semiconductor package 1000 according to at least this example embodiment, the package substrate 200 is not limited to a structure or a material of the PCB.

The substrate shielding layer 320 may be formed on a top surface of the package substrate 200, that is, on the top surface of the body layer 210. The substrate shielding layer 320 may be formed of a ferromagnetic material. For example, the substrate shielding layer 320 may be formed of a ferromagnetic material that may be used for the magnetic shielding layer 120a of the semiconductor device 100a. The substrate shielding layer 320 may be formed of the same or substantially the same ferromagnetic material as that of the magnetic shielding layer 120a, or may be formed of a ferromagnetic material different from that of the magnetic shielding layer 120a. The substrate shielding layer 320 may be formed by forming a ferromagnetic material layer on the entire top surface of the body layer 210 and then patterning the ferromagnetic material layer to a desired size and/or a desired shape. For example, the substrate shielding layer 320 may have the same or substantially the same area as, for example, that of the MRAM chip 110 of the semiconductor device 100a. The substrate shielding layer 320 may be formed on the top surface of the body layer 210 by using PVD, spin coating, plating, etc. However, a method of forming the substrate shielding layer 320 is not limited to these examples.

As described above, the semiconductor device 100a may be stacked on the substrate shielding layer 320 by using the adhesive layer 330. Due to the stacking of the semiconductor device 100a, the magnetic shielding layer 120a of the semiconductor device 100a and the substrate shielding layer 320 may be connected to each other. Through the connection, the magnetic shielding layer 120a and the substrate shielding layer 320 may form a U-shaped or ⊏⋅-shaped ferromagnetic shielding structure.

Since the semiconductor device 100a is stacked on the substrate shielding layer 320 through the adhesive layer 330, a first thickness D1 of a protrusion of the via shielding layer 124a may be the same or substantially the same as a thickness of the adhesive layer 330. Accordingly, when the adhesive layer 330 is relatively (e.g., very) thin, the via shielding layer 124a may protrude relatively little (e.g., hardly protrude) from a bottom surface of the MRAM chip 110, and in this case, the semiconductor device 100a may be the same or substantially the same as the semiconductor device 100 of FIG. 1A. Alternatively, the semiconductor device 100 of FIG. 1A may be directly stacked on the substrate shielding layer 320 without the adhesive layer 330 by using thermo-compression. Furthermore, the semiconductor device 100 of FIG. 1A may be stacked on the substrate shielding layer 320 by using an adhesive having ferromagnetic characteristics.

The sealing material 300 may protect the semiconductor device 100a from external physical and/or chemical damage by sealing the semiconductor device 100a. The sealing material 300 may be, for example, an epoxy material, a thermocurable material, a thermoplastic material, a ultraviolet (UV) curable material, etc. When the sealing material 300 is a thermocurable material, the sealing material 300 may include a phenol-based curing agent, an acid anhydride-based curing agent, an amine-based curing agent, an acrylic polymer additive, etc.

Also, the sealing material 300 may be formed of a resin and may include a filler. For example, the sealing material 300 may be formed of an epoxy material including a silica filler in an amount of about 80%. However, filler content is not limited to this example. For example, a modulus of the sealing material 300 may be appropriately adjusted by appropriately adjusting filler content. For reference, the modulus refers to an elastic modulus. A material having a relatively low modulus may be soft and/or flexible, and a material having a relatively high modulus may be stiff and/or hard.

The external connection terminal 400 may enable the entire semiconductor package 1000 to be mounted on an external system substrate or a main board. The external connection terminal 400 may be formed on an external connection pad 230 of the package substrate 200. The external connection terminal 400 may include, for example, solder balls.

In the semiconductor package 1000, since the semiconductor device 100a is stacked on the package substrate 200 on which the substrate shielding layer 320 is formed and the magnetic shielding layer 120a of the semiconductor device 100a and the substrate shielding layer 320 form a U-shaped or ⊏⋅-shaped ferromagnetic shielding structure, an external magnetic field may be effectively shielded. Accordingly, the semiconductor package 1000 including the semiconductor device 100a having relatively high reliability may be provided. More particularly, in the semiconductor package 1000, since the U-shaped or ⊏⋅-shaped ferromagnetic shielding structure that surrounds the MRAM chip 110 is formed, the reliability of the semiconductor package 1000 including a perpendicular MRAM may be improved (e.g., greatly improved).

FIGS. 20 through 23 are cross-sectional views of semiconductor packages according to example embodiments. For convenience of explanation, the description already made with reference to FIGS. 1A through 19 will be briefly given or omitted.

Figure 20:
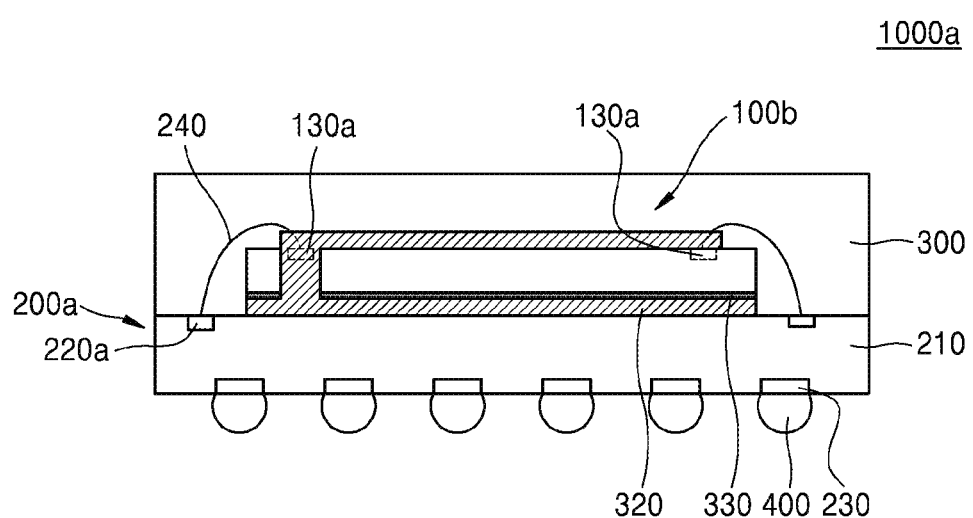
FIGS. 20 through 23 are cross-sectional views of semiconductor packages according to example embodiments.

Referring to FIG. 20, a semiconductor package 1000a may be similar to the semiconductor package 1000 of FIG. 19, except that the semiconductor device 100b of FIG. 6A is stacked on a package substrate 200a. In the semiconductor package 1000a, the first and second pad areas PA1 and PA2 of the semiconductor device 100b may be on both sides as shown in FIG. 6A. Also, substrate pads 220a may be on both sides of the package substrate 200a to correspond to an arrangement of the pad areas PA1 and PA2 of the semiconductor device 100b. Accordingly, pads 130a on both sides of the semiconductor device 100b and the substrate pads 220a on both sides of the package substrate 200a may be electrically connected to each other through wires, and the semiconductor device 100b may be stacked on the package substrate 200a by using wire bonding.

Figure 21:
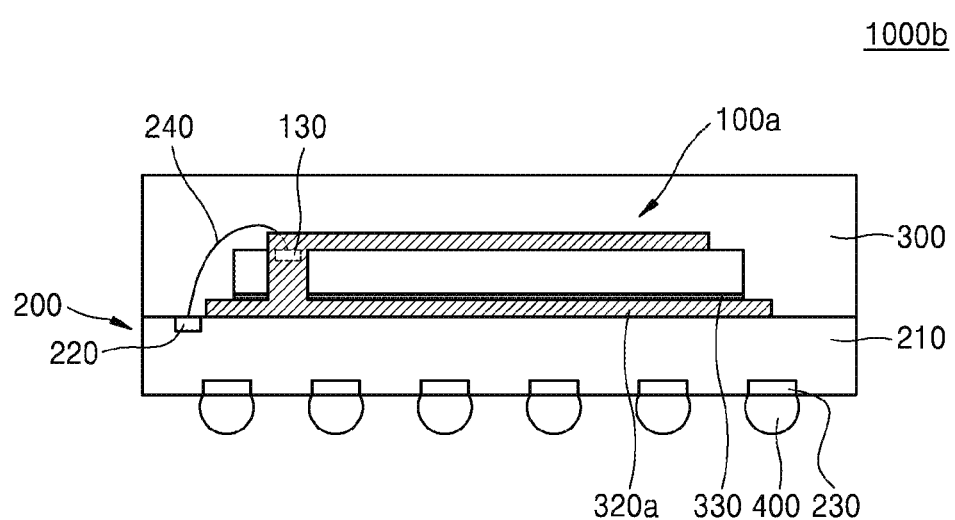

Referring to FIG. 21, a semiconductor package 1000b may be similar to the semiconductor package 1000 of FIG. 19, except in a structure of a substrate shielding layer 320a. In the semiconductor package 1000b, the substrate shielding layer 320a may have an area that is greater than an area of the MRAM chip 110 of the semiconductor device 100a. As such, since the substrate shielding layer 320a is more widely formed than the MRAM chip 110, a process of stacking the semiconductor device 100a may be more easily performed, and the semiconductor device 100a may be more stably stacked on, and adhered to, the substrate shielding layer 320a. For example, as long as the substrate pad 220 of the package substrate 200 is exposed, the substrate shielding layer 320a may be more widely formed than the MRAM chip 110 of the semiconductor device 100a.

Figure 22:
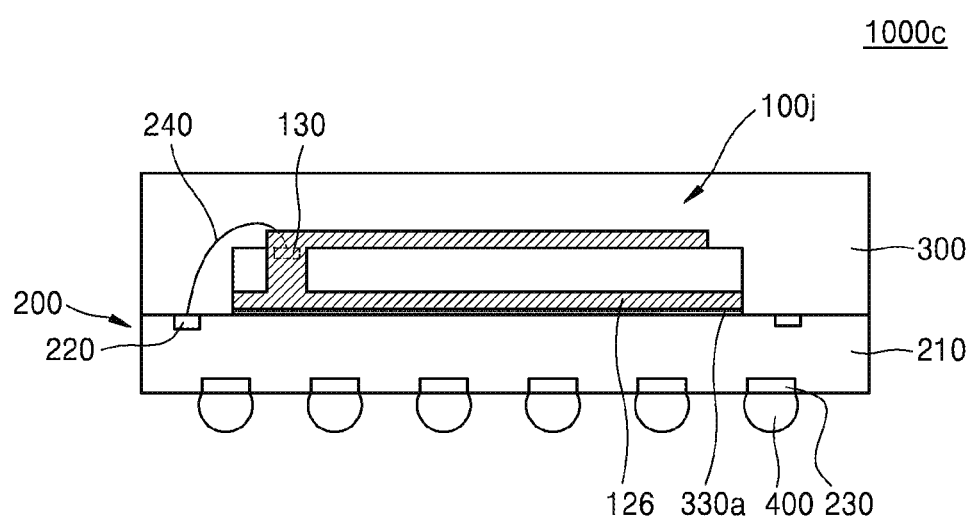

Referring to FIG. 22, a semiconductor package 1000c may be similar to the semiconductor package 1000 of FIG. 19, except that the semiconductor device 100j of FIG. 12A is stacked on the package substrate 200. In the semiconductor package 1000c, the magnetic shielding layer 120j of the semiconductor device 100j may include the lower shielding layer 126 as shown in FIG. 12A. Accordingly, an additional substrate shielding layer may not be formed on the package substrate 200. Accordingly, the semiconductor device 100j may be directly stacked on the package substrate 200 through an adhesive layer 330a, and may be electrically connected to the package substrate 200 through the wire 240.

Figure 23:
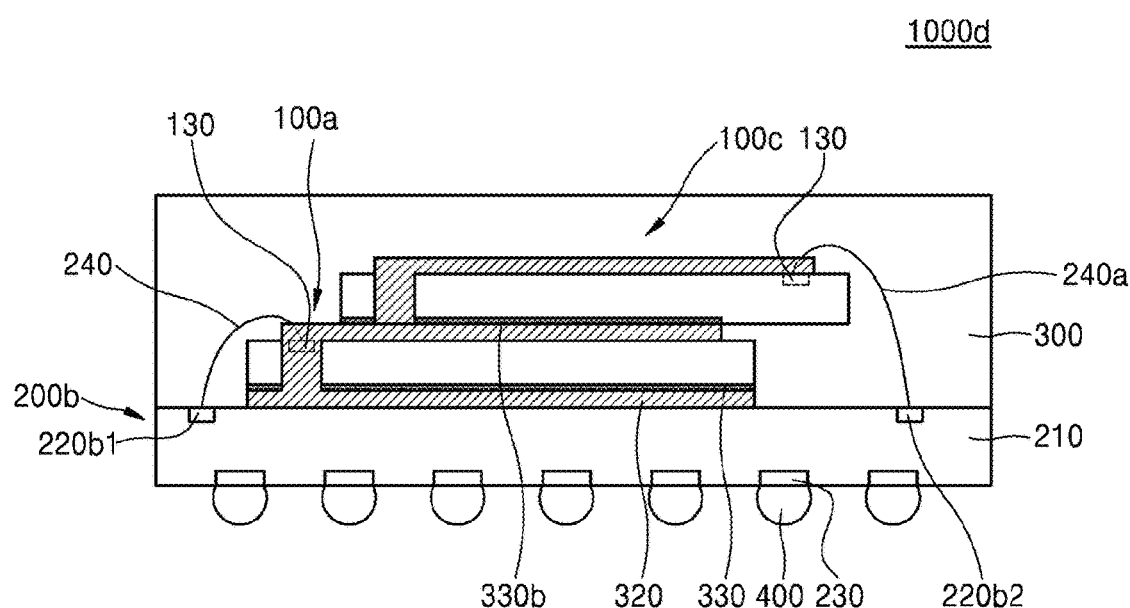

Referring to FIG. 23, in a semiconductor package 1000d two semiconductor devices 100a and 100c may be sequentially stacked on a package substrate 200b, unlike the semiconductor devices of the above example embodiments. In more detail, for example, the semiconductor device 100a of FIG. 2 may be stacked on the substrate shielding layer 320 on the package substrate 200b and then the semiconductor device 100c of FIG. 6B may be stacked on the semiconductor device 100a. Stacking of the semiconductor device 100a of FIG. 2 on the substrate shielding layer 320 has been described with reference to FIG. 19.

According to one or more example embodiments, the semiconductor device 100c of FIG. 6B may be stacked on and adhered to a top surface of the upper shielding layer 122 of the semiconductor device 100a of FIG. 2 through an adhesive layer 330b. The stacked semiconductor device 100c is in a state where the left and right sides of the semiconductor device 100c of FIG. 6B are reversed. Accordingly, the via shielding layer 124b of the stacked semiconductor device 100c may be located on the left side and the pad 130 of the pad area PA may be located on the right side. The semiconductor device 100a of FIG. 2 may be electrically connected to a substrate pad 220b1 that is on the left side of the package substrate 200b through the wire 240 that is a left wire and the semiconductor device 100c of FIG. 6B may be electrically connected to a substrate pad 220b2 that is on the right side of the package substrate 200b through a right wire 240a.

As long as the via shielding layers 124a and 124b of the semiconductor device 100a of FIG. 2 and the semiconductor device 100c of FIG. 6B are perpendicularly or substantially perpendicularly connected to some extent and the upper shielding layer 122, which is an uppermost layer, and the substrate shielding layer 320 form a U-shaped or ⊏ ⋅ -shaped structure, the upper shielding layer 122 of the semiconductor device 100a of FIG. 2 may be omitted.

In the semiconductor package 1000d, although two semiconductor devices 100a and 100c are stacked on the package substrate 200b, a structure of the semiconductor package 1000d is not limited thereto. For example, the semiconductor package 1000d may include three or more semiconductor devices stacked on the package substrate 200b.

Figure 24A:
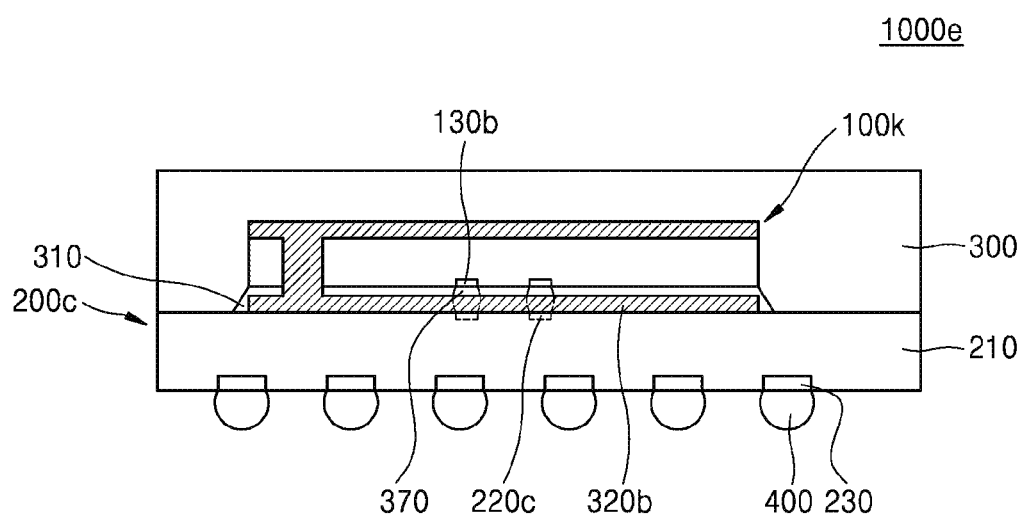
FIG. 24A is a cross-sectional view of a semiconductor package according to an example embodiment.
Figure 24B:
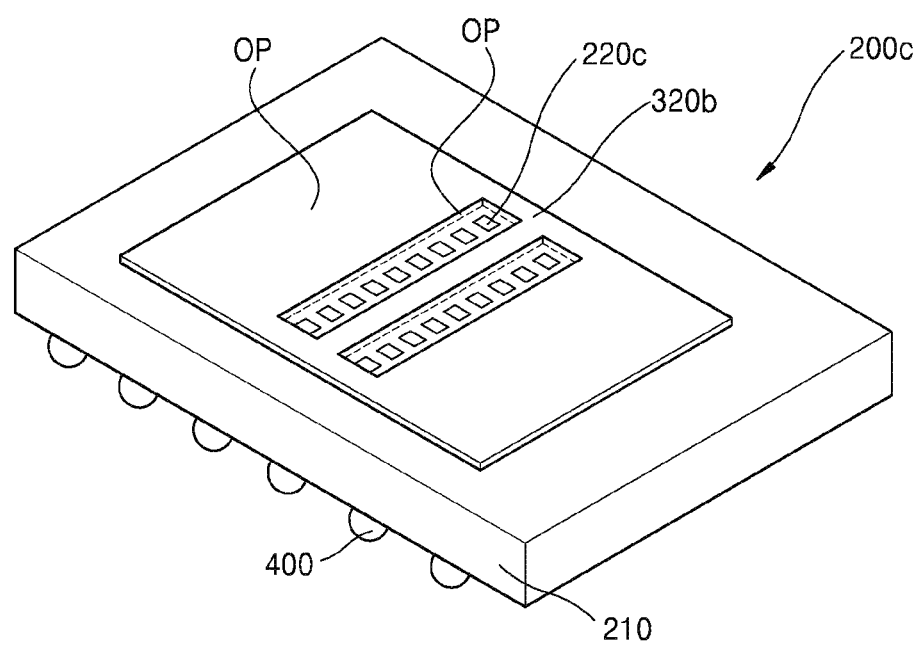
FIG. 24B is a perspective view of an example embodiment of a package substrate in the semiconductor package of FIG. 24A.

FIG. 24A is a cross-sectional view of a semiconductor package 1000e according to another example embodiment. FIG. 24B is a perspective view of a package substrate 200c in the semiconductor package 1000e shown in FIG. 24A. For convenience of explanation, the description already made with reference to FIGS. 1A through 23 will be only briefly given or omitted.

Referring to FIGS. 24A and 24B, the semiconductor package 1000e is similar to the above-described example embodiments, except in that the semiconductor device 100k of FIG. 13A is stacked on the package substrate 200c by using flip-chip bonding. For example, the semiconductor device 100k may be stacked so that the front surface F, an active surface of the MRAM chip 110, on which pads 130b are formed, faces the package substrate 200c, and the pads 130b of the MRAM chip 110 and substrate pads 220c of the package substrate 200c may be physically and electrically connected to each other through the bumps 370.

The substrate shielding layer 320b on the package substrate 200c may include the open areas OP that expose portions on which the substrate pads 220c are disposed as shown in FIG. 24B. Also, as described with reference to FIGS. 13A and 13B, a second thickness D2 of a protrusion of the via shielding layer 124c may vary according to a thickness of the bumps 370 and a thickness of the substrate shielding layer 320b. When a thickness of the bumps 370 and a thickness of the substrate shielding layer 320b are the same or substantially the same, the via shielding layer 124c may not protrude, and the via shielding layer 124c may be connected (e.g., directly connected) to the substrate shielding layer 320b.

When a height of the bumps 370 is greater than a thickness of the substrate shielding layer 320b, a space may be formed between the package substrate 200c and the MRAM chip 110 of the semiconductor device 100k and may be filled with, for example, an underfill 310. The underfill 310 may be formed of an underfill resin such as an epoxy resin and may include a silica filler or a flux. The underfill 310 may be formed of a material that is different from a material of the sealing material 300 formed on an outer portion. Alternatively, the underfill 310 may be formed of the same or substantially the same material as that of the sealing material 300. If necessary, the space formed between the package substrate 200c and the MRAM chip 110 may also be filled with the sealing material 300 by using a molded underfill (MUF) process.

Figure 25:
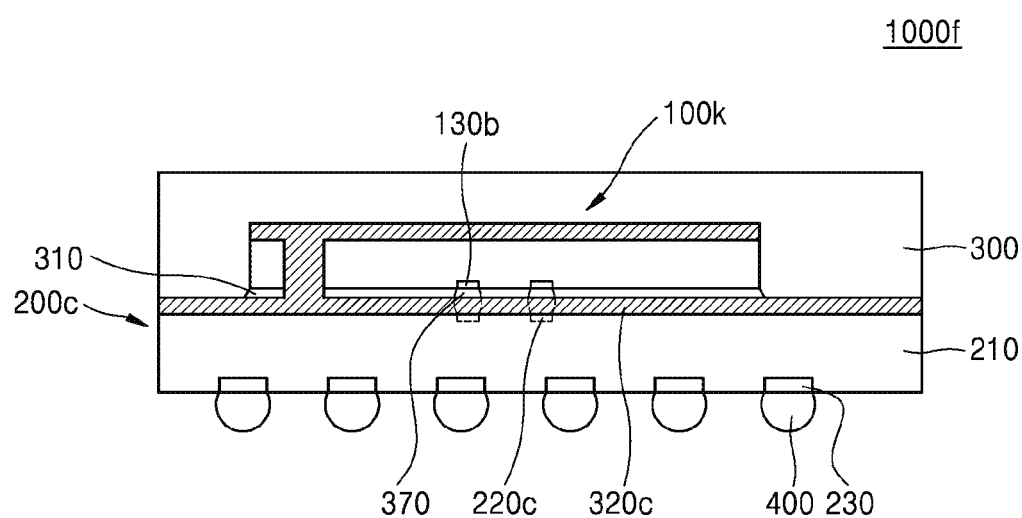
FIG. 25 is a cross-sectional view of a semiconductor package according to an example embodiment.

FIG. 25 is a cross-sectional view of a semiconductor package 1000f according to an example embodiment. For convenience of explanation, the description already made with reference to FIGS. 1A through 24 will be only briefly given or omitted.

Referring to FIG. 25, the semiconductor package 1000f may be similar to the semiconductor package 1000e of FIG. 24A, except in a structure of a substrate shielding layer 320c. For example, in the semiconductor package 1000f the substrate shielding layer 320c may be formed to have an area that is greater than an area of the MRAM chip 110 of the semiconductor device 100k. For example, the substrate shielding layer 320c may cover an entire surface of the package substrate 200c. The substrate shielding layer 320c may include the open areas OP that expose the substrate pads 220c at a central portion, like the substrate shielding layer 320b of the semiconductor package 1000e of FIG. 24A.

In the semiconductor package 1000f, since the substrate pads 220c are at a central portion of the package substrate 200c, an outer portion of the package substrate 200c may be covered with the substrate shielding layer 320c. Accordingly, in a process of patterning the substrate shielding layer 320c, the outer portion of the package substrate 200c is not patterned and is maintained, thereby more easily performing the process of patterning the substrate shielding layer 320c.

Example embodiments of semiconductor package structures in which the semiconductor devices 100a, 100b, 100c, 100j, and 100k of FIGS. 2, 6A, 6B, 12A, and 13A, respectively, are stacked on a package substrate have been described. However, semiconductor package structures according to one or more example embodiments are not limited thereto. For example, semiconductor packages according to at least some example embodiments may include structures in which the semiconductor devices 100, 100d, 100e, 100f, 100g, 100h, 100i, and/or 100l of FIGS. 1A, 7 through 10B, 11A, and 18A, respectively, are stacked on package substrates. Also, the semiconductor packages are not limited thereto, and may include structures in which semiconductor devices having various other structures are stacked on package substrates. According to example embodiments, the semiconductor devices having various other structures include a magnetic shielding layer that is stacked on a package substrate to form a U-shaped or ⊏-shaped ferromagnetic shielding structure.

FIGS. 26A through 30 are plan views and cross-sectional views for explaining an example embodiment of a process of manufacturing the semiconductor device 100 of FIGS. 1A and 1B. FIGS. 26B, 27B, and 28B are cross-sectional views respectively taken along line VIII-VIII' in FIGS. 26A, 27A, and 28A. For convenience of explanation, the description already made with reference to FIGS. 1A and 1B will be only briefly given or omitted.

Figure 26A:
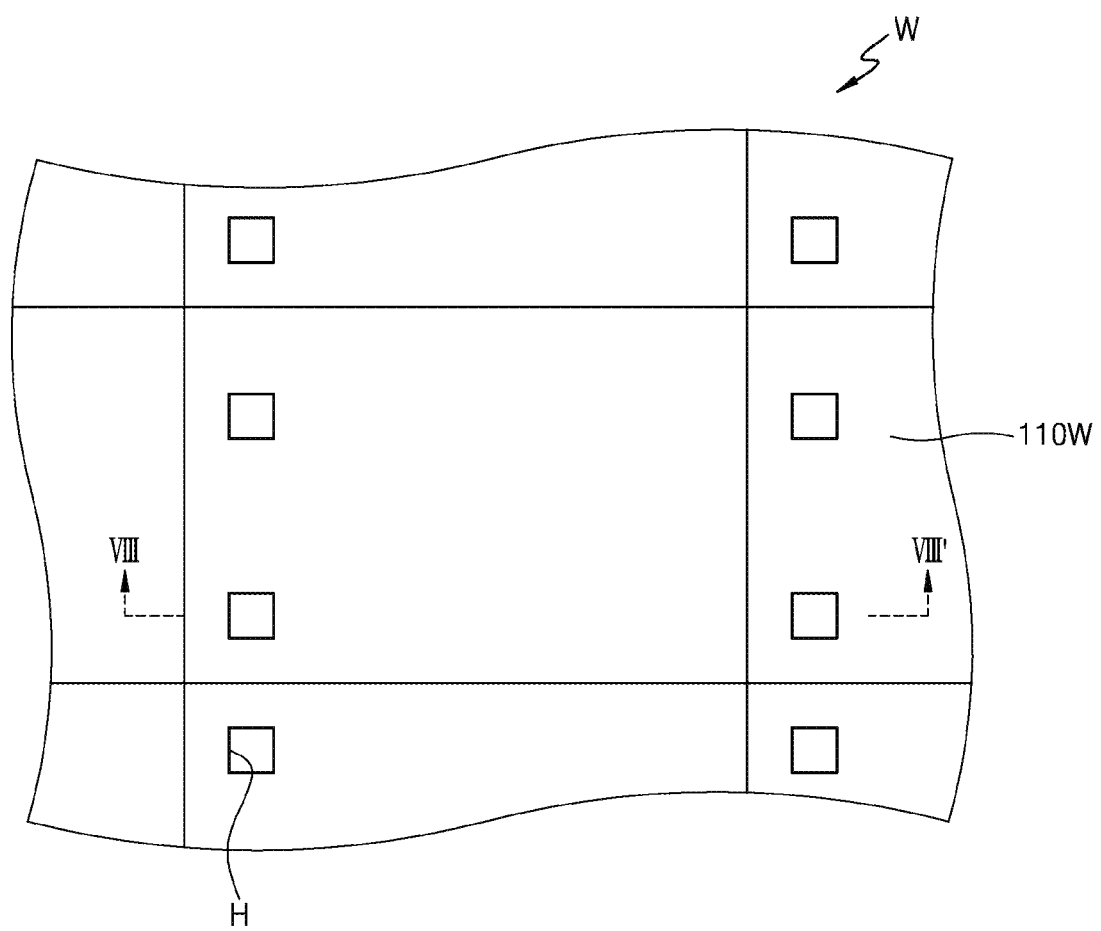
FIGS. 26A through 30 are cross-sectional views for explaining an example embodiment of a process of manufacturing the semiconductor device shown in FIGS. 1A and 1B.
Figure 26B:
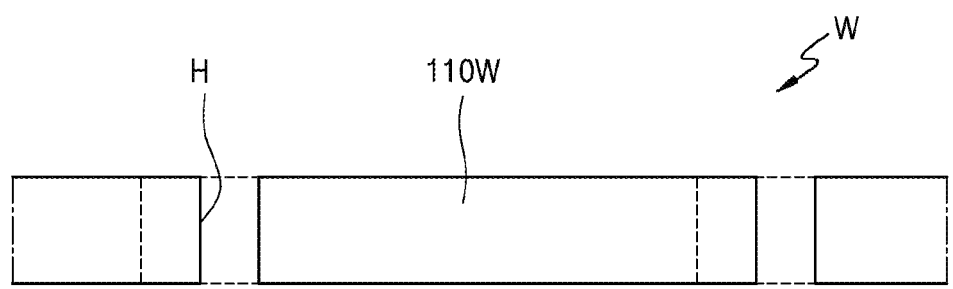

Referring to FIGS. 26A and 26B, first, a through-hole H is formed through each of MRAM chips 110W of a wafer W. The through-hole H may be formed by using, for example, laser drilling, etching, etc. In the wafer W, the MRAM chip 110W whose chip process at a wafer level has been completed may be in a state where top surfaces of the pads 130 are not opened. For example, the top surfaces of the pads 130 of the MRAM chip 110W may be covered and protected by a passivation film. The passivation film may be, for example, an oxide film or a nitride film, or may be a double layer including an oxide film and a nitride film.

Although two through-holes H are formed in each MRAM chip 110W, the number of the through-holes H is not limited thereto. Also, positions of the through-holes H may be variously selected according to positions of the pads 130 of the MRAM chip 110W. For example, the through-holes H may be formed outside a pad area on which the pads 130 of the MRAM chip 110W are disposed.

Figure 27A:
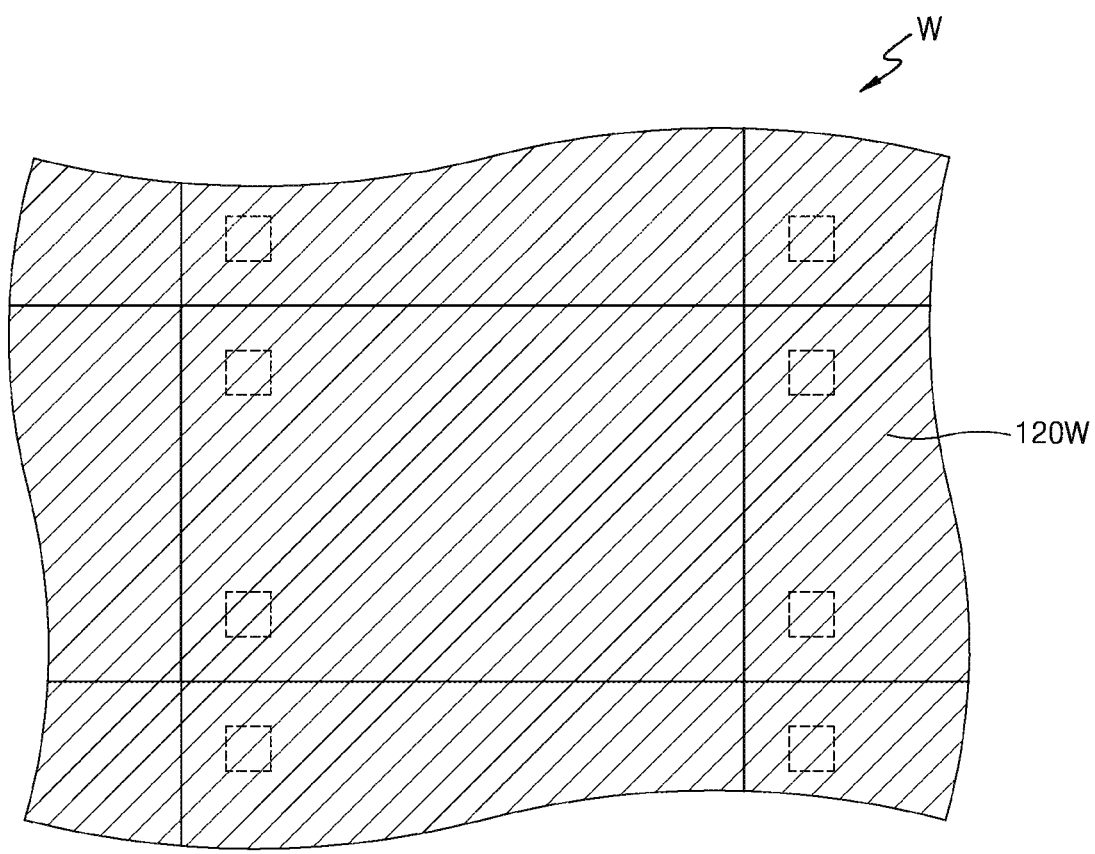
Figure 27B:
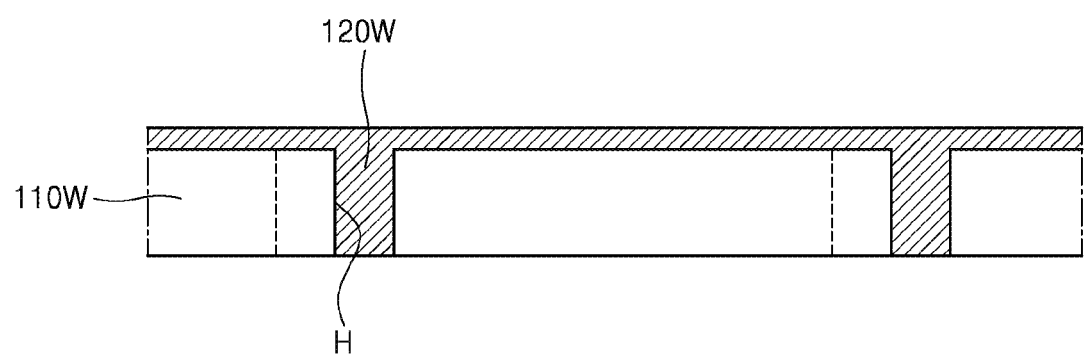

Referring to FIGS. 27A and 27B, after the through-holes H are formed, a ferromagnetic layer 120W is formed by depositing a ferromagnetic material on a top surface (e.g., an entire top surface) of the wafer W. The ferromagnetic material may be deposited by using sputtering, plating, or the like. However, example embodiments of methods of depositing the ferromagnetic material are not limited to these examples. The ferromagnetic layer 120W may be divided into a ferromagnetic layer portion that fills the through-holes H and a ferromagnetic layer portion on the top surface of the wafer W. The ferromagnetic layer portion that fills the through-holes H may correspond to a via shielding layer and the ferromagnetic layer portion on the top surface of the wafer W may correspond to an upper shielding layer.

Figure 28A:
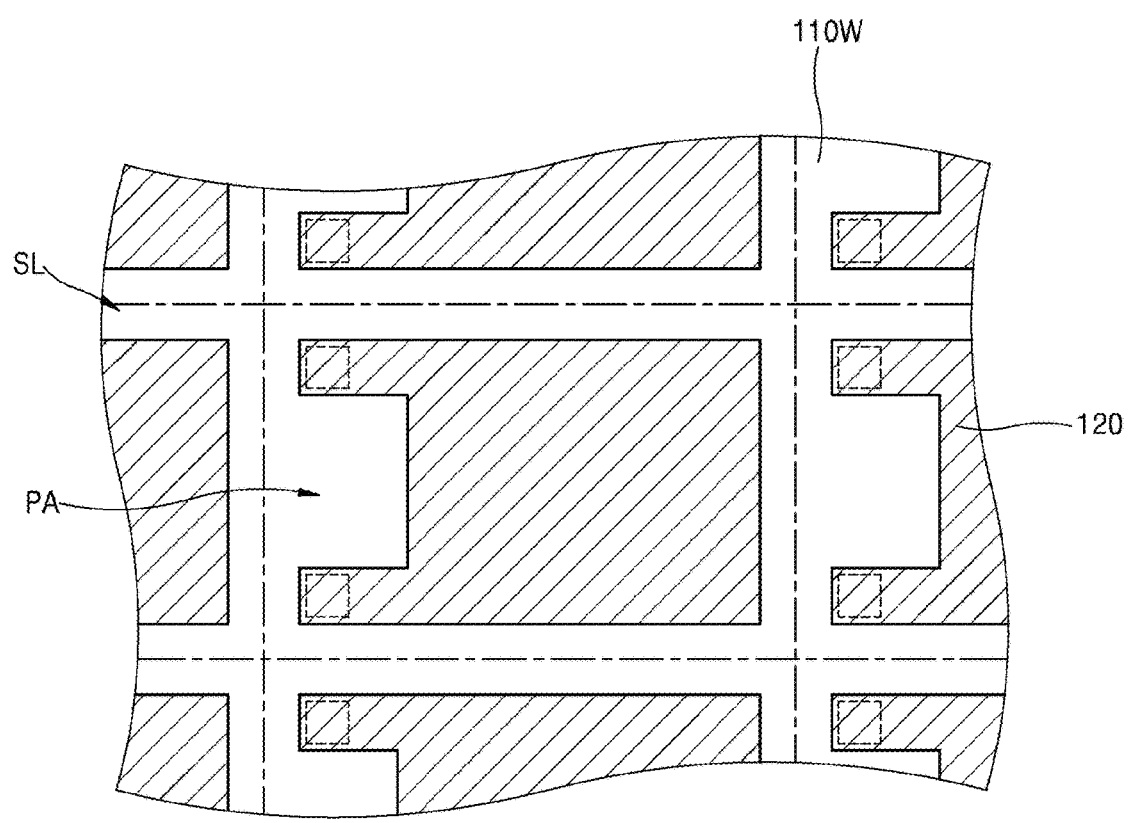
Figure 28B:
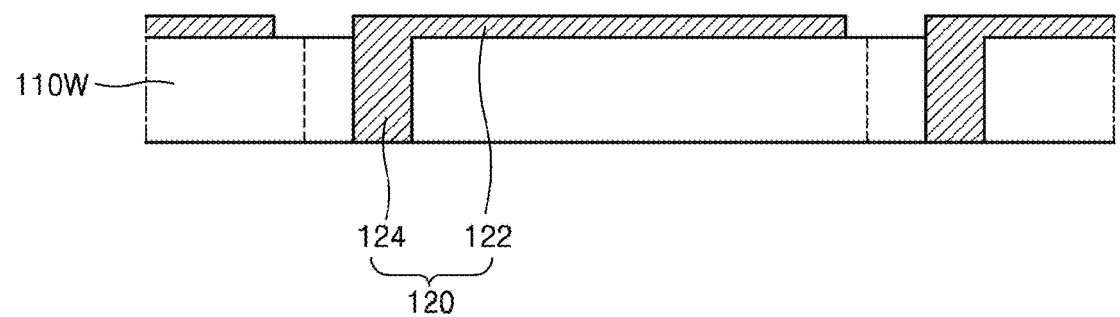

Referring to FIGS. 28A and 28B, after the ferromagnetic layer 120W is formed, the ferromagnetic layer 120W is patterned. The patterning of the ferromagnetic layer 120W may be performed by removing a portion of the ferromagnetic layer 120W over an outer portion of each of the MRAM chips 110W to expose, for example, a scribe lane SL. Also, the patterning of the ferromagnetic layer 120W may include removing a portion of the ferromagnetic layer 120W over the pad area PA to expose the pad area PA on which the pads 130 of the MRAM chip 110W are disposed. Due to the patterning of the ferromagnetic layer 120W, the magnetic shielding layer 120 including the upper shielding layer 122 and the via shielding layer 124 may be formed on the MRAM chip 110W.

As show in FIGS. 1A through 2 and 6A through 13B, the pad area PA may be disposed on any of various positions of the MRAM chip 110W. Accordingly, the patterning of the ferromagnetic layer 120W may be appropriately performed according to a position of the pad area PA. The patterning of the ferromagnetic layer 120W may be performed by using ion beam etching (IBE), reactive ion etching (RIE), or the like. According to at least some example embodiments, the patterning of the ferromagnetic layer 120W may be performed by using photolithography.

Figure 29:
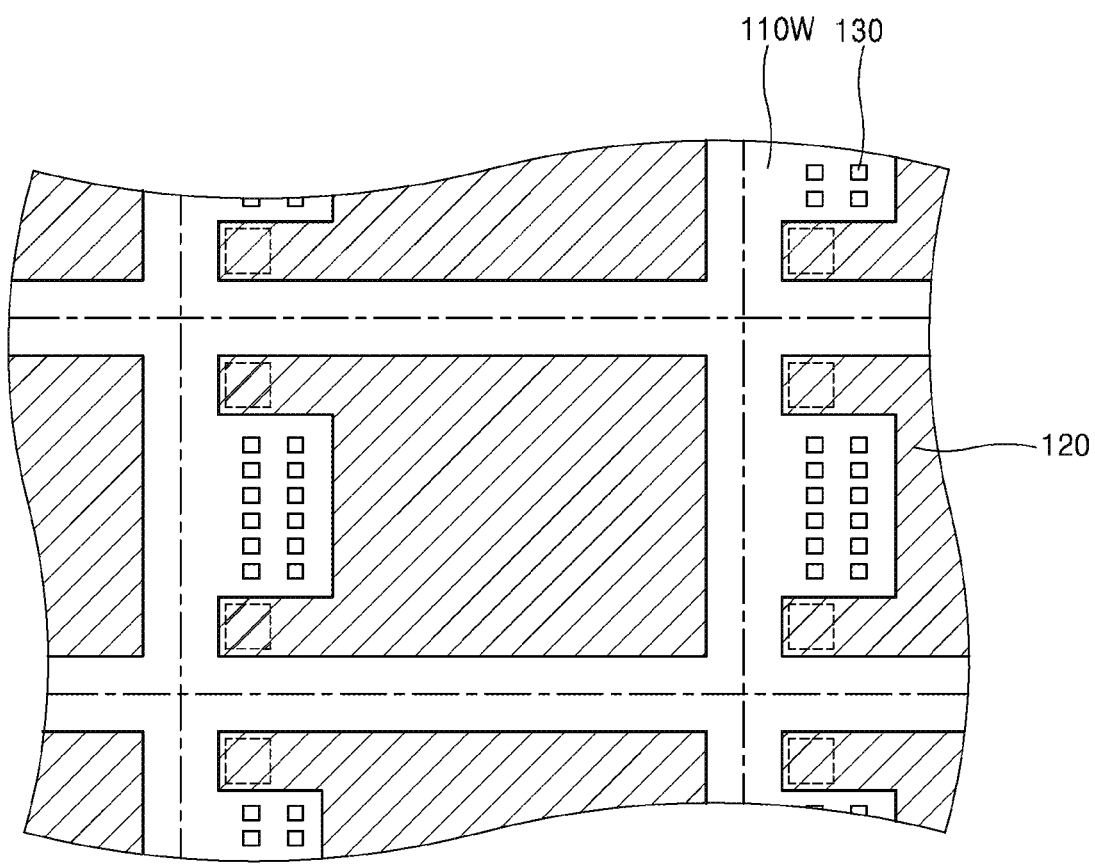

Referring to FIG. 29, after the magnetic shielding layer 120 is formed on the MRAM chip 110W, the pads 130 of the pad area PA of the MRAM chip 110W are opened. The pads 130 may be opened by removing the passivation film that covers the top surfaces of the pads 130.

Figure 30:
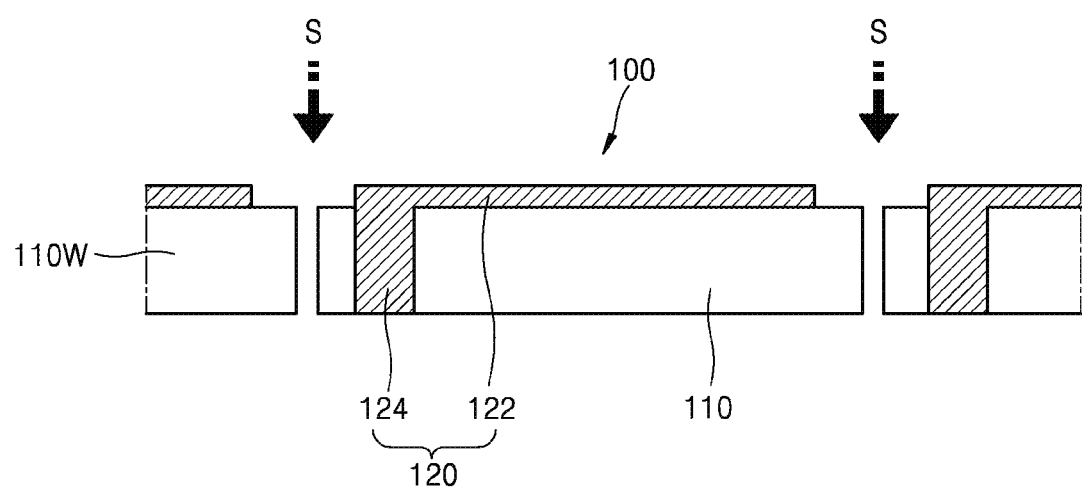

Referring to FIG. 30, after the pads 130 are opened, a sawing process of cutting the scribe lane as marked by an arrow S is performed. Due to the sawing process, the semiconductor device 100 is singulated from the wafer W. The semiconductor device 100 may include the MRAM chip 110 and the magnetic shielding layer 120, and may correspond to the semiconductor device 100 of FIG. 1A.

Figure 31:
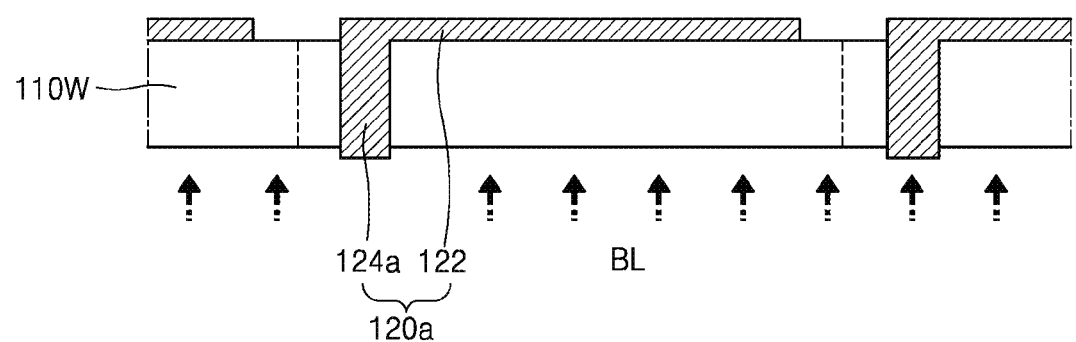
FIG. 31 is a cross-sectional view for explaining an example embodiment of a process of manufacturing the semiconductor device shown in FIG. 2.

FIG. 31 is a cross-sectional view for explaining an example embodiment of a process of manufacturing the semiconductor device 100a of FIG. 2, showing operations after FIGS. 28A and 28B. For convenience of explanation, the description already made with reference to FIGS. 2 and 26A through 30 will be only briefly given or omitted.

Referring to FIG. 31, after the magnetic shielding layer 120 is formed on the MRAM chip 110W, a rear surface of the wafer W is removed by a given (or alternatively, desired or predetermined) thickness by using, for example, a back lap (BL) process of grinding the rear surface of the wafer W. Due to the BL process, the via shielding layer 124a may protrude from the rear surface of the wafer W. A thickness of a protrusion of the via shielding layer 124a may be appropriately selected in consideration of a thickness of an adhesive layer when the semiconductor device 100a is stacked on a package substrate.

Even in a process of manufacturing the semiconductor device 100 of FIG. 1A, the BL process may be performed. Due to the BL process, a thickness of the semiconductor device 100 may be reduced, thereby making a semiconductor package formed as a thin film.

After the via shielding layer 124a protrudes from the rear surface of the wafer W, the semiconductor device 100a of FIG. 2 may be completely singulated by using a process of opening the pads 130 of FIG. 29 and a sawing process of FIG. 30.

Figure 32A:
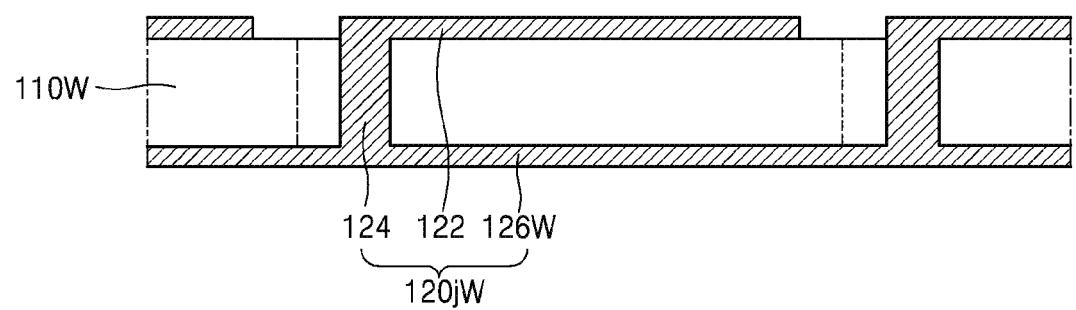
FIGS. 32A and 32B are cross-sectional views for explaining an example embodiment of a process of manufacturing the semiconductor device shown in FIGS. 12A and 12B.
Figure 32B:
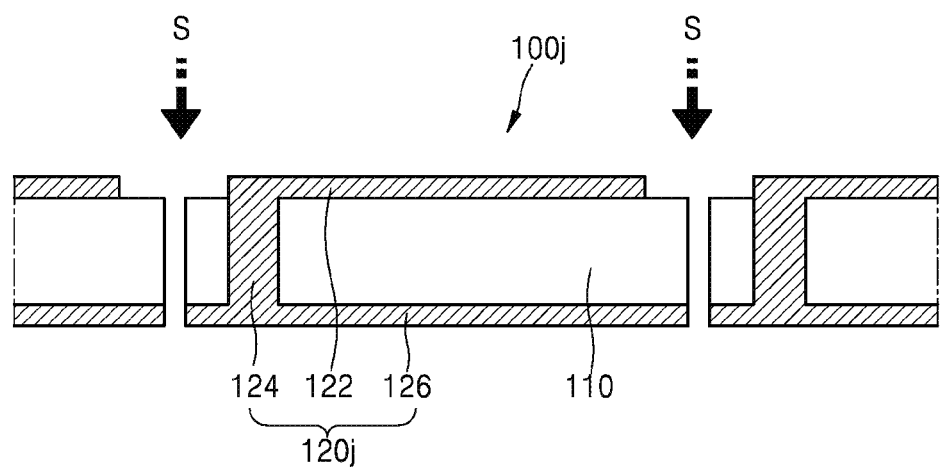

FIGS. 32A and 32B are cross-sectional views for explaining an example embodiment of a process of manufacturing the semiconductor device 100j of FIGS. 12A and 12B, showing operations after FIGS. 28A and 28B. For convenience of explanation, the description already made with reference to FIGS. 12A, 12B, and 26A through 30 will be only briefly given or omitted.

Referring to FIG. 32A, after the magnetic shielding layer 120 is formed on the MRAM chip 110W, a lower ferromagnetic layer 126W is formed by depositing a ferromagnetic material on the rear surface of the wafer W. A method of forming the lower ferromagnetic layer 126W may be the same or substantially the same as a method of forming the ferromagnetic layer 120W described with reference to FIGS. 27A and 27B. Due to the lower ferromagnetic layer 126W, a pre-magnetic shielding layer 120jW may be formed on the MRAM chip 110. The pre-magnetic shielding layer 120jW may include parts of the upper shielding layer 122, the via shielding layer 124, and the lower ferromagnetic layer 126W. Next, a process of opening the pads 130 of FIG. 29 may be performed.

Referring to FIG. 32B, after the process of opening the pads 130 is performed, a sawing process of cutting the scribe lane as marked by an arrow S is performed. After the sawing process, the semiconductor device 100j is singulated from the wafer W. As described for the semiconductor device 100j of FIG. 12A, the magnetic shielding layer 120j of the singulated semiconductor device 100*j* may include the upper shielding layer 122, the via shielding layer 124, and the lower shielding layer 126.

Figure 33A:
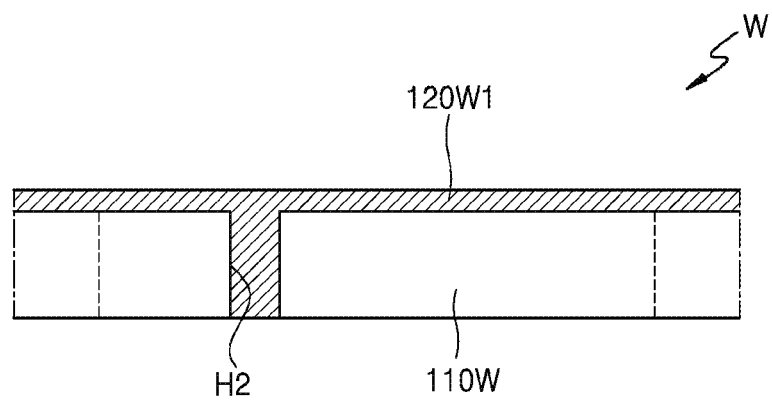
FIGS. 33A through 33C are cross-sectional views for explaining an example embodiment of a process of manufacturing the semiconductor device shown in FIGS. 18A and 18B.
Figure 33B:
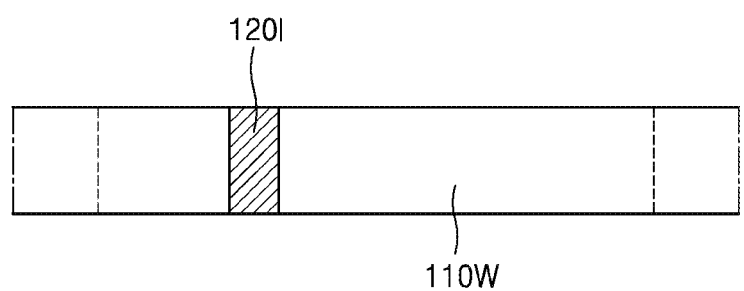
Figure 33C:
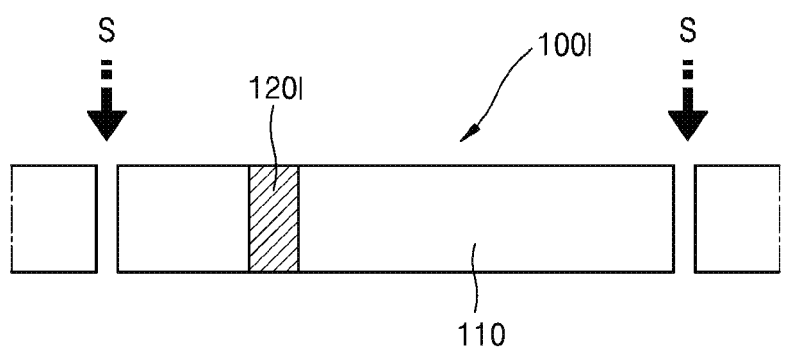

FIGS. 33A through 33C are cross-sectional views for explaining an example embodiment of a process of manufacturing the semiconductor device 100*l* of FIGS. 18A and 18B. FIG. 33A is a cross-sectional view corresponding to FIG. 27B, FIG. 33B is a cross-sectional view corresponding to FIG. 28B, and FIG. 33C is a cross-sectional view corresponding to FIG. 30. For convenience of explanation, the description already made with reference to FIGS. 18A, 18B, and 26A through 30 will be only briefly given or omitted.

Referring to FIG. 33A, after a through-hole H2 is formed in the MRAM chip 110W of the wafer W, a ferromagnetic layer 120W1 is formed by depositing a ferromagnetic material. The through-hole H2 may be formed in a security area whose reliability is relatively important as described with reference to FIGS. 18A and 18B. A method of forming the ferromagnetic layer 120W1 may be the same or substantially the same as a method of forming the ferromagnetic layer 120W described with reference to FIGS. 27A and 27B.

Referring to FIG. 33B, after the ferromagnetic layer 120W1 is formed, the ferromagnetic layer 120W1 is patterned. The patterning of the ferromagnetic layer 120W1 may be performed by removing, for example, an entire portion of the ferromagnetic layer 120W1 from a top surface of the wafer W except for a portion of the ferromagnetic layer 120W1 filled in the through-hole H2. The patterning of the ferromagnetic layer 120W1 may be performed by using IBE, RIE, or the like, as described with reference to FIGS. 28A and 28B. Due to the patterning of the ferromagnetic layer 120W1, the magnetic shielding layer 120*l* having a via structure may be formed in the MRAM chip 110W. Next, a process of opening the pads 130 of FIG. 29 may be performed.

Referring to FIG. 33C, after the process of opening the pads 130 is performed, the semiconductor device 100*l* is singulated from the wafer W. The singulated semiconductor device 100*l* may include the magnetic shielding layer 120*l* having a via structure and the MRAM chip 110.

In methods of manufacturing semiconductor devices, according to one or more example embodiments, pads are opened after a ferromagnetic layer is patterned. However, the pads may be opened before a through-hole is formed. When the pads are opened before the through-hole is formed, an additional process of opening the pads need not be performed after the ferromagnetic layer is patterned. For reference, even when the pads are previously opened, since the pads are exposed again during a subsequent process of patterning the ferromagnetic layer, the previous opening of the pads does not matter. However, when the pads that are opened are likely to be contaminated during a series of processes for forming a magnetic shielding layer, the pads may be opened after the ferromagnetic layer is patterned.

FIGS. 34A through 34E are cross-sectional views for explaining an example embodiment of a process of manufacturing the semiconductor package 1000 of FIG. 19. For convenience of explanation, the description already made with reference to FIGS. 1A through 33C will be only briefly given or omitted.

Figure 34A:
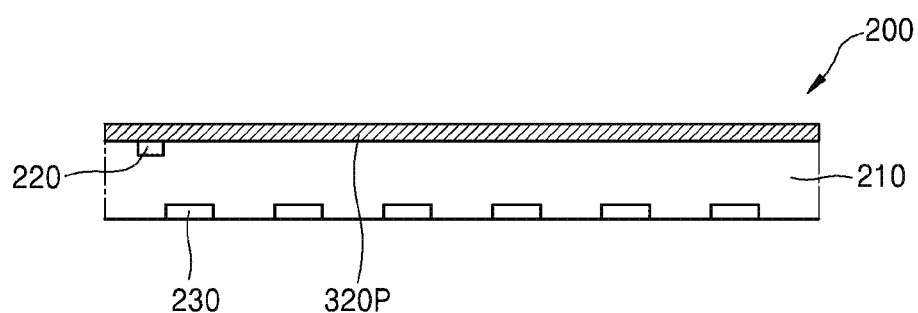
FIGS. 34A through 34E are cross-sectional views for explaining an example embodiment of a process of manufacturing the semiconductor package shown in FIG. 19.

Referring to FIG. 34A, an initial substrate shielding layer 320P is formed on an entire top surface of the package substrate 200. The package substrate 200 may be an original substrate before each semiconductor package is singulated. Alternatively, the package substrate 200 may be a singulated substrate corresponding to each singulated semiconductor package. The initial substrate shielding layer 320P may be formed on the package substrate 20 as described for a method of forming the ferromagnetic layer 120W with reference to FIGS. 27A and 27B.

Figure 34B:
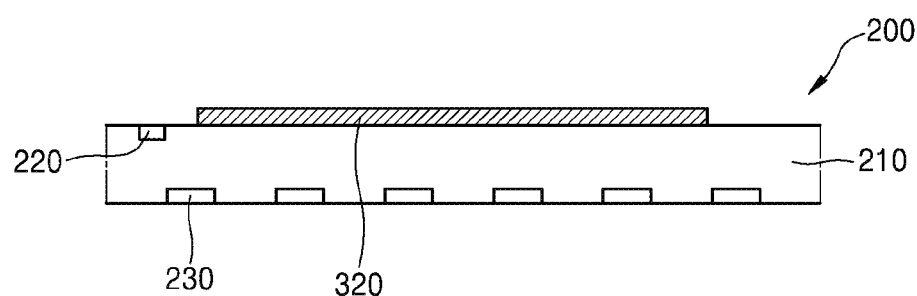

Referring to FIG. 34B, after the initial substrate shielding layer 320P is formed, the initial substrate shielding layer 320P is patterned. The patterning of the initial substrate shielding layer 320P may be performed by removing a portion of the initial substrate shielding layer 320P over an outer portion of the package substrate 200 when the substrate pad 220 is on the outer portion of the package substrate 200. Also, as shown in FIG. 24B, when the substrate pads 220*c* are at a central portion of the package substrate 200*c*, the patterning of the initial substrate shielding layer 320P may be performed by removing a portion of the initial substrate shielding layer 320P over a central portion including the substrate pads 220*c*.

The initial substrate shielding layer 320P may be patterned to have the same or substantially the same area as an area of the MRAM chip 110 of the stacked semiconductor device 100*a* or 100*b* as in the semiconductor package 1000 or 1000*a* of FIG. 19 or 20, or the initial substrate shielding layer 320P may be patterned to expose only the substrate pad 220 irrespective of an area of the MRAM chip 110 as in the semiconductor package 1000*b* of FIG. 21.

Due to the patterning of the initial substrate shielding layer 320P, the substrate shielding layer 320 may be formed on the package substrate 200. In the process of manufacturing the semiconductor package 1000, an area of the substrate shielding layer 320 may be the same or substantially the same as an area of the MRAM chip of the semiconductor device 100*a* or 100*b* stacked on the package substrate 200.

Figure 34C:
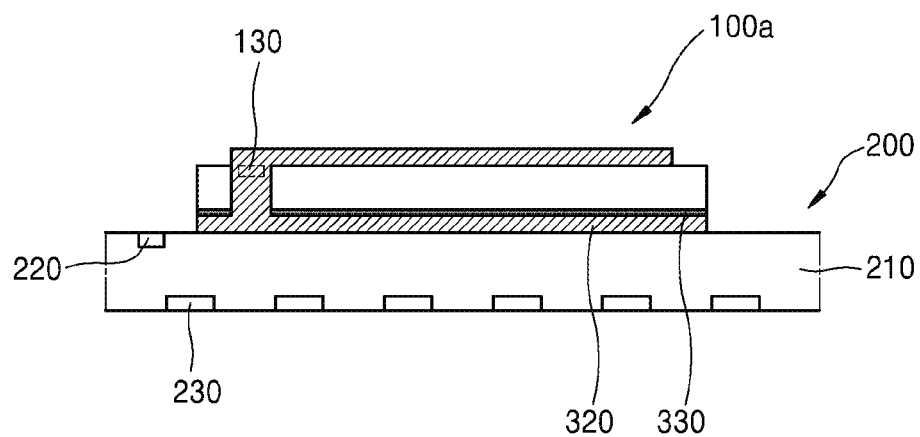

Referring to FIG. 34C, after the substrate shielding layer 320 is formed, the semiconductor device 100*a* of FIG. 2 is stacked on and adhered to the substrate shielding layer 320 by using the adhesive layer 330. If necessary, the semiconductor device 100 of FIG. 1A may be stacked on the substrate shielding layer 320. The semiconductor device 100 of FIG. 1A may be stacked, for example, by using a relatively thin (e.g., very thin) adhesive layer, by using thermo-compression without an adhesive layer, or by using an adhesive formed of a ferromagnetic material.

Figure 34D:
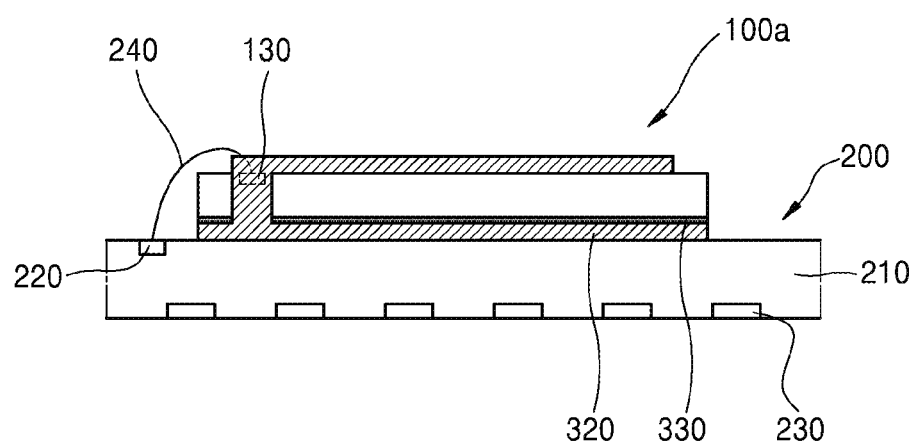

Referring to FIG. 34D, after the semiconductor device 100*a* is stacked on the substrate shielding layer 320, the pad 130 of the MRAM chip 110 and the substrate pad 220 of the package substrate 200 are electrically connected to each other through the wire 240. Since the MRAM chip 110 is electrically connected to and stacked on the package substrate 200 through the wire 240, the MRAM chip 110 may be stacked on the package substrate 200 by using wire bonding.

Figure 34E:
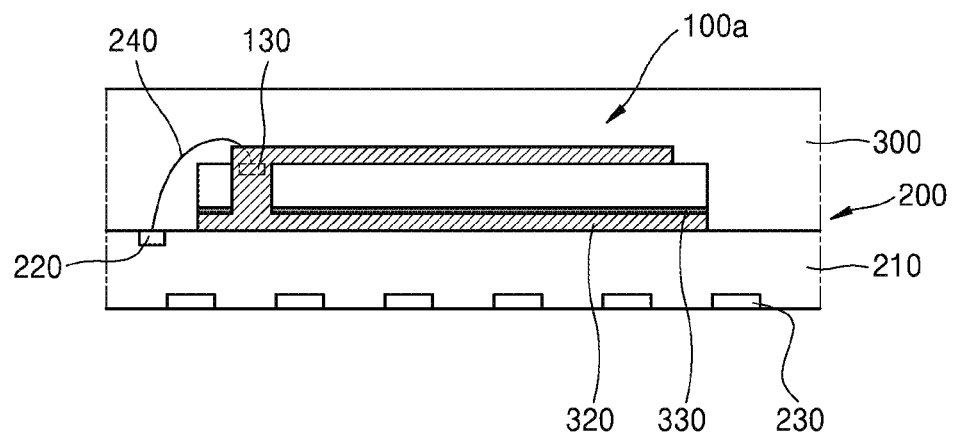

Referring to FIG. 34E, the sealing material 300 that seals the semiconductor device 100*a* is formed. The external connection terminal 400 (see FIG. 19) may be formed on the external connection pad 230, and singulation for a semiconductor package may be performed through a sawing process. Due to the singulation through the sawing process, the semiconductor package 1000 of FIG. 19 may be completed.

According to the one or more example embodiments, since a semiconductor device includes a magnetic shielding layer that is formed on a top surface of a MRAM chip and in a hole, when the semiconductor device is stacked on a package substrate including a substrate shielding layer to form a semiconductor package, a U-shaped or ⊏-shaped ferromagnetic shielding structure is formed, thereby providing a more reliable memory device having relatively high resistance to an external magnetic field.

Also, according to the one or more example embodiments, since a method of manufacturing a semiconductor device includes forming a magnetic shielding layer at a wafer level and singulating the semiconductor device by using sawing, the method has relatively little effect on (e.g., hardly effects) a subsequent package process. Accordingly, problems such as an increased process difficulty, increased time and/or costs, which may be caused by an additional shielding layer in the package process, may be suppressed.

While inventive concepts have been particularly shown and described with reference to example embodiments thereof, it will be understood that various changes in form and details may be made therein without departing from the spirit and scope of the following claims.

What is claimed is:

1. A method of manufacturing a magnetic random-access memory (MRAM) device, the method comprising:
    forming a plurality of semiconductor chips on a wafer, each of the plurality of semiconductor chips including a MRAM having a perpendicular magnetic tunnel junction (pMTJ) structure;
    forming at least one hole through each of the plurality of semiconductor chips;
    depositing a ferromagnetic material on the wafer to form a via shielding layer and an upper shielding layer, the via shielding layer filling the at least one hole through each of the plurality of semiconductor chips, the upper shielding layer covering a top surface of each of the plurality of semiconductor chips, and the upper shielding layer connected to the via shielding layer;
    patterning the upper shielding layer to expose portions of each of the semiconductor chips, the portions of each of the semiconductor chips including scribe lanes, and pads of a corresponding semiconductor chip among the plurality of semiconductor chips, and removing the upper shielding layer from each outer boundary of each of the semiconductor chips which goes beyond the scribe lanes, the via shielding layer extends along at most two outer edges of the shielding layer; and
    sawing the wafer along the scribe lanes to singulate each of the plurality of semiconductor chips.

2. A method of manufacturing a magnetic random-access memory (MRAM) package, the method comprising:
    preparing a MRAM device, the MRAM device including a semiconductor chip including a MRAM, the MRAM having a perpendicular magnetic tunnel junction (pMTJ) structure, and
        a magnetic shielding layer including an upper shielding layer and a via shielding layer, the upper shielding layer on a top surface of the semiconductor chip, and the via shielding layer extending from the upper shielding layer through the semiconductor chip;
    depositing a ferromagnetic material on a package substrate to form a substrate shielding layer;
    stacking the MRAM device on the package substrate to connect the via shielding layer to the substrate shielding layer; and
    forming a sealing material to seal the MRAM device;
    wherein the preparing of the MRAM device includes
        forming a plurality of semiconductor chips on a wafer, each of the plurality of semiconductor chips including a MRAM having a pMTJ structure,
        forming at least one hole through each of the plurality of semiconductor chips;
        depositing a ferromagnetic material on the wafer to form a via shielding layer and an upper shielding layer, the via shielding layer filling the at least one hole formed through each of the plurality of semiconductor chips, and the upper shielding layer covering a top surface of each of the plurality of semiconductor chips, the upper shielding layer connected to the via shielding layer;
        patterning the upper shielding layer to remove portions of the upper shielding layer at portions of each of the semiconductor chips, the portions of each of the semiconductor chips including scribe lanes and pads of a corresponding semiconductor chip among the plurality of semiconductor chips, and removing the upper shielding layer from each outer boundary of each of the plurality of semiconductor chips which goes beyond the scribe lanes, the via shielding layer extends along at most two outer edges of the shielding layer; and
        sawing the wafer along the scribe lanes to singulate each of the plurality of semiconductor chips.

3. A method of manufacturing a magnetic random access memory (MRAM) device, the method comprising:
    forming at least one first through-hole through a semiconductor wafer;
    forming a ferromagnetic layer on the semiconductor wafer, the ferromagnetic layer filling the at least one first through-hole;
    patterning the ferromagnetic layer to expose a scribe lane and at least a first pad area portion on an upper surface of the semiconductor wafer, and to form a magnetic shielding layer, the magnetic shielding layer including at least a via shielding layer filling the at least one first through-hole, and removing the ferromagnetic layer from each outer boundary of the semiconductor wafer which goes beyond the scribe lanes, a plurality of the at least one first through-holes extends along only one outer edges of the magnetic shielding layer; and
    cutting the semiconductor wafer along the scribe lane to form the MRAM device.

4. The method of claim 3, wherein the at least one first through-hole has an elongated edge that is parallel to an edge of the MRAM device.

5. The method of claim 3, further comprising:
    forming at least one second through-hole through the semiconductor wafer, the at least one first through-hole and the at least one second through-hole spaced apart from one another in a plane of the upper surface of the semiconductor wafer; and
    wherein the patterning includes
        removing at least a first portion of the ferromagnetic layer to expose the first pad area portion and the scribe lane on the upper surface of the semiconductor wafer, and to form an upper shielding layer on the upper surface of the semiconductor wafer, wherein the via shielding layer fills the at least one first through-hole and the at least one second through-hole.

6. The method of claim 5, wherein a bottom surface of the via shielding layer is planar with a bottom surface of the semiconductor wafer.

7. The method of claim 5, wherein a bottom surface of the via shielding layer protrudes from a bottom surface of the semiconductor wafer.

8. The method of claim 5, wherein the first pad area portion is between the at least one first through-hole and the at least one second through-hole.

9. The method of claim 8, wherein a bottom surface of the via shielding layer protrudes from a bottom surface of the semiconductor wafer.

10. The method of claim 5, wherein the patterning comprises:
removing at least a second portion of the ferromagnetic layer to expose a second pad area portion on the upper surface of the semiconductor wafer; wherein
the first pad area portion is at a first side of the upper surface of the semiconductor wafer,
the second pad area portion is at a second side of the upper surface of the semiconductor wafer, and
the first and second sides are opposite one another.

11. The method of claim 5, wherein
the first pad area portion is at a first side of the upper surface of the semiconductor wafer;
the first through-hole and the second through-hole are at a second side of the semiconductor wafer; and
the first side is opposite to the second side.

12. The method of claim 5, wherein
the forming at least one first through-hole includes
forming a pair of first through-holes along opposite edges of the semiconductor wafer; and
the forming at least one second through-hole includes
forming a pair of second through-holes along opposite edges of the semiconductor wafer;
the first pad area portion is between the pair of first through-holes and the pair of second through-holes; and
the via shielding layer fills the pair of first through-holes and the pair of second through-holes.

13. The method of claim 5, wherein the first pad area portion is exposed through a central portion of the ferromagnetic layer.

14. The method of claim 5, wherein
the forming at least one first through-hole includes
forming a plurality of first through-holes along a first edge of the semiconductor wafer;
the forming at least one second through-hole includes
forming a plurality of second through-holes along a second edge of the semiconductor wafer, the second edge being opposite to the first edge; and
the via shielding layer fills the plurality of first through-holes and the plurality of second through-holes.

15. The method of claim 5, further comprising:
forming a lower shielding layer on a bottom surface of the semiconductor wafer.

16. The method of claim 3, wherein a bottom surface of the via shielding layer is planar with a bottom surface of the semiconductor wafer.

17. The method of claim 3, wherein a bottom surface of the via shielding layer protrudes from a bottom surface of the semiconductor wafer.

* * * * *